United States Patent
Haba et al.

(10) Patent No.: US 12,525,506 B2
(45) Date of Patent: Jan. 13, 2026

(54) EMBEDDED COOLING SYSTEMS FOR ADVANCED DEVICE PACKAGING AND METHODS OF MANUFACTURING THE SAME

(71) Applicant: Adeia Semiconductor Bonding Technologies Inc., San Jose, CA (US)

(72) Inventors: Belgacem Haba, Saratoga, CA (US); Ron Zhang, Sunnyvale, CA (US); Kyong-Mo Bang, Fremont, CA (US); Suhail Jaan Sadiq, Dublin, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 18/787,506

(22) Filed: Jul. 29, 2024

(65) Prior Publication Data
US 2025/0253205 A1 Aug. 7, 2025

Related U.S. Application Data

(60) Provisional application No. 63/575,161, filed on Apr. 5, 2024, provisional application No. 63/550,702, filed on Feb. 7, 2024.

(51) Int. Cl.
*H01L 23/46* (2006.01)
*H01L 23/00* (2006.01)
(Continued)

(52) U.S. Cl.
CPC .......... *H01L 23/46* (2013.01); *H01L 23/5384* (2013.01); *H01L 24/08* (2013.01);
(Continued)

(58) Field of Classification Search
CPC ................ H01L 24/08; H01L 25/0657; H01L 2224/08225; H01L 23/46; H01L 23/5384
See application file for complete search history.

(56) References Cited

U.S. PATENT DOCUMENTS

| | | | |
|---|---|---|---|
| 4,274,479 | A | 6/1981 | Eastman |
| 5,309,986 | A | 5/1994 | Itoh |
| 5,522,452 | A | 6/1996 | Mizuno et al. |
| 5,769,154 | A | 6/1998 | Adkins et al. |

(Continued)

FOREIGN PATENT DOCUMENTS

| | | | |
|---|---|---|---|
| CN | 109524373 | A | 3/2019 |
| CN | 111128976 | A | 5/2020 |

(Continued)

OTHER PUBLICATIONS

Evan G. Colgan, "A Practical Implementation of Silicon Microchannel Coolers", available online at <https://www.electronics-cooling.com/2007/11/a-practical-implementation-of-silicon-microchannel-coolers/>, Nov. 1, 2007, 10 pages.

(Continued)

*Primary Examiner* — Mamadou L Diallo
(74) *Attorney, Agent, or Firm* — HALEY GUILIANO LLP

(57) ABSTRACT

A device package comprising an integrated cooling assembly comprising a semiconductor stack and a cooling channel, wherein the semiconductor stack comprises a first semiconductor device and a second semiconductor device stacked vertically above the first semiconductor device; and spacers extending between opposing surfaces of the first and second semiconductor devices to space the first semiconductor device away from the second semiconductor device, the spacers and the opposing surfaces of the first and second semiconductor devices collectively define the cooling channel therebetween; and the spacers comprise via electrically connecting the first semiconductor device and the second semiconductor device.

18 Claims, 18 Drawing Sheets

(51) Int. Cl.
  *H01L 23/538* (2006.01)
  *H01L 25/065* (2023.01)
(52) U.S. Cl.
  CPC .............. *H01L 25/0657* (2013.01); *H01L 2224/08225* (2013.01); *H01L 2225/06572* (2013.01)

(56) References Cited

U.S. PATENT DOCUMENTS

| | | | |
|---|---|---|---|
| 6,056,044 | A | 5/2000 | Benson et al. |
| 6,351,384 | B1 | 2/2002 | Daikoku et al. |
| 6,686,532 | B1 | 2/2004 | Macris |
| 6,822,326 | B2 | 11/2004 | Enquist et al. |
| 7,289,326 | B2 | 10/2007 | Heydari et al. |
| 7,485,957 | B2 | 2/2009 | Brandenburg et al. |
| 7,511,372 | B2 | 3/2009 | Chiu |
| 7,523,617 | B2 | 4/2009 | Venkatasubramanian et al. |
| 7,622,324 | B2 | 11/2009 | Enquist et al. |
| 7,692,926 | B2 | 4/2010 | Henderson et al. |
| 7,957,137 | B2 | 6/2011 | Prasher |
| 7,978,473 | B2 | 7/2011 | Campbell et al. |
| 7,997,087 | B2 | 8/2011 | Venkatasubramanian et al. |
| 8,164,169 | B2 | 4/2012 | Chrysler et al. |
| 8,630,091 | B2 | 1/2014 | Ward et al. |
| 9,224,673 | B2 | 12/2015 | Chen et al. |
| 9,299,641 | B2 | 3/2016 | Sekar et al. |
| 9,355,932 | B2 | 5/2016 | Ankireddi et al. |
| 9,391,143 | B2 | 7/2016 | Tong et al. |
| 9,553,071 | B1 | 1/2017 | Haba |
| 9,741,638 | B2 | 8/2017 | Hsieh et al. |
| 9,741,696 | B2 | 8/2017 | Katkar et al. |
| 9,746,248 | B2 | 8/2017 | Semenov et al. |
| 9,768,149 | B2 | 9/2017 | Vadhavkar et al. |
| 9,818,723 | B2 | 11/2017 | Haba |
| 10,032,695 | B2 | 7/2018 | Iyengar et al. |
| 10,083,934 | B2 | 9/2018 | Haba |
| 10,157,818 | B2 | 12/2018 | Chen et al. |
| 10,170,392 | B2 | 1/2019 | Chainer et al. |
| 10,199,356 | B2 | 2/2019 | Kinsley |
| 10,312,221 | B1 | 6/2019 | Agarwal et al. |
| 10,332,823 | B2 | 6/2019 | Chen et al. |
| 10,461,059 | B2 | 10/2019 | Koopmans et al. |
| 10,694,641 | B2 | 6/2020 | Basu et al. |
| 10,978,427 | B2 | 4/2021 | Li et al. |
| 11,187,469 | B2 | 11/2021 | Karesh |
| 11,387,164 | B2 | 7/2022 | Wu et al. |
| 11,598,594 | B2 | 3/2023 | Lewis et al. |
| 11,996,351 | B2 | 5/2024 | Hsiao et al. |
| 2003/0157782 | A1 | 8/2003 | Kellar et al. |
| 2004/0184237 | A1 | 9/2004 | Chang |
| 2004/0251530 | A1 | 12/2004 | Yamaji |
| 2005/0126766 | A1 | 6/2005 | Lee et al. |
| 2005/0213301 | A1 | 9/2005 | Prasher |
| 2006/0042825 | A1 | 3/2006 | Lu et al. |
| 2006/0103011 | A1 | 5/2006 | Andry et al. |
| 2007/0025082 | A1 | 2/2007 | Lee et al. |
| 2007/0107875 | A1 | 5/2007 | Lee et al. |
| 2008/0096320 | A1 | 4/2008 | Farrar |
| 2009/0057879 | A1* | 3/2009 | Garrou .................. H01L 23/481 257/713 |
| 2009/0122491 | A1 | 5/2009 | Martin et al. |
| 2010/0116534 | A1 | 5/2010 | Choi et al. |
| 2010/0230805 | A1 | 9/2010 | Refai-Ahmed |
| 2010/0300202 | A1 | 12/2010 | Joyce |
| 2011/0129986 | A1 | 6/2011 | Libralesso et al. |
| 2011/0201151 | A1* | 8/2011 | Gambino ............. H01L 25/0657 438/107 |
| 2013/0044431 | A1 | 2/2013 | Koeneman |
| 2013/0050944 | A1 | 2/2013 | Shepard |
| 2013/0087904 | A1 | 4/2013 | Clark et al. |
| 2014/0027895 | A1* | 1/2014 | Mizuno ................ H01L 23/46 438/109 |
| 2014/0126150 | A1 | 5/2014 | Song et al. |
| 2015/0194363 | A1 | 7/2015 | Jun et al. |
| 2015/0287672 | A1 | 10/2015 | Yazdani |
| 2016/0276314 | A1 | 9/2016 | Ching et al. |
| 2017/0012016 | A1 | 1/2017 | Joshi et al. |
| 2017/0092565 | A1 | 3/2017 | Chen et al. |
| 2017/0103937 | A1 | 4/2017 | Hsieh et al. |
| 2018/0053730 | A1 | 2/2018 | Shao et al. |
| 2018/0087842 | A1 | 3/2018 | Chainer et al. |
| 2018/0090427 | A1 | 3/2018 | Bernstein et al. |
| 2018/0160565 | A1 | 6/2018 | Parida |
| 2018/0211900 | A1 | 7/2018 | Gutala et al. |
| 2018/0308783 | A1 | 10/2018 | Refai-Ahmed et al. |
| 2019/0008071 | A1 | 1/2019 | Kim |
| 2019/0221493 | A1* | 7/2019 | Chang .................. H01L 25/072 |
| 2019/0355706 | A1 | 11/2019 | Enquist et al. |
| 2019/0385928 | A1 | 12/2019 | Leobandung |
| 2020/0035583 | A1 | 1/2020 | Beauchemin et al. |
| 2020/0105639 | A1 | 4/2020 | Valavala et al. |
| 2020/0312742 | A1 | 10/2020 | Lofgreen et al. |
| 2020/0343160 | A1 | 10/2020 | Mizerak et al. |
| 2020/0350233 | A1 | 11/2020 | Mizerak et al. |
| 2020/0352053 | A1 | 11/2020 | Mizerak et al. |
| 2020/0395313 | A1 | 12/2020 | Mallik et al. |
| 2021/0066164 | A1 | 3/2021 | Wu et al. |
| 2021/0175143 | A1 | 6/2021 | Yu et al. |
| 2021/0183741 | A1 | 6/2021 | Jha et al. |
| 2021/0193548 | A1 | 6/2021 | Wan et al. |
| 2021/0193620 | A1 | 6/2021 | Refai-Ahmed et al. |
| 2021/0280497 | A1 | 9/2021 | Brun et al. |
| 2021/0288037 | A1 | 9/2021 | Tao et al. |
| 2021/0378106 | A1 | 12/2021 | Iyengar et al. |
| 2021/0378139 | A1 | 12/2021 | Rice et al. |
| 2021/0410329 | A1 | 12/2021 | Yang et al. |
| 2022/0037231 | A1 | 2/2022 | Hsiao et al. |
| 2022/0087059 | A1 | 3/2022 | Sathyamurthy et al. |
| 2022/0117115 | A1 | 4/2022 | Malouin et al. |
| 2022/0130734 | A1 | 4/2022 | Chiu et al. |
| 2022/0189850 | A1 | 6/2022 | Liff et al. |
| 2022/0210949 | A1 | 6/2022 | Edmunds et al. |
| 2022/0230937 | A1 | 7/2022 | Malouin et al. |
| 2022/0408592 | A1 | 12/2022 | Malouin et al. |
| 2023/0048500 | A1 | 2/2023 | Malouin et al. |
| 2023/0154828 | A1* | 5/2023 | Haba .................... H01L 21/187 257/714 |
| 2023/0156959 | A1 | 5/2023 | Malouin et al. |
| 2023/0197566 | A1* | 6/2023 | Waidhas ............. H01L 23/4012 257/720 |
| 2023/0207474 | A1 | 6/2023 | Uzoh et al. |
| 2023/0245950 | A1 | 8/2023 | Haba et al. |
| 2023/0284421 | A1 | 9/2023 | Malouin et al. |
| 2023/0298969 | A1 | 9/2023 | Park et al. |
| 2023/0420339 | A1 | 12/2023 | Lai et al. |
| 2024/0038633 | A1 | 2/2024 | Haba et al. |
| 2024/0047396 | A1* | 2/2024 | Raman .................. H01L 24/08 |
| 2024/0047424 | A1* | 2/2024 | Zhou ..................... H01L 24/80 |
| 2024/0071969 | A1* | 2/2024 | Kirby .................... H01L 24/46 |
| 2024/0203821 | A1* | 6/2024 | Kang .................... H01L 23/427 |
| 2024/0203823 | A1 | 6/2024 | Uzoh et al. |
| 2024/0222222 | A1* | 7/2024 | Haba .................. H01L 25/0652 |
| 2024/0222226 | A1 | 7/2024 | Haba |
| 2024/0249995 | A1 | 7/2024 | Haba |
| 2024/0249998 | A1 | 7/2024 | Gao et al. |
| 2024/0266255 | A1 | 8/2024 | Haba et al. |

FOREIGN PATENT DOCUMENTS

| | | |
|---|---|---|
| CN | 111698824 A | 9/2020 |
| CN | 115719735 A | 2/2023 |
| JP | 2000-340727 A | 12/2000 |
| KR | 10-1049508 B1 | 7/2011 |
| KR | 10-2023-0136509 A | 9/2023 |
| TW | 200834871 A | 8/2008 |
| WO | 2013/097146 A1 | 7/2013 |

OTHER PUBLICATIONS

Francisco Pires, "TSMC Exploring On-Chip, Semiconductor-Integrated Watercooling", tom's Hardware, retrieved from https://

(56) References Cited

OTHER PUBLICATIONS www.tomshardware.com/news/tsmc-exploring-on-chip-semiconductor-integrated-watercooling, Jul. 13, 2021, 23 pages.
IBM, "Functional electronic packaging—Thermal management roadmap", available online at <https://web.archive.org/web/20170220095511/https://www.zurich.ibm.com/st/electronicpackaging/cooling.html>, Feb. 20, 2017, 7 pages.
International Search Report and Written Opinion received for PCT Patent Application No. PCT/US23/28942, mailed on Nov. 16, 2023, 12 pages.
International Search Report and Written Opinion received for PCT Patent Application No. PCT/US23/84874, mailed on Apr. 22, 2024, 7 pages.
International Search Report and Written Opinion received for PCT Patent Application No. PCT/US23/85801, mailed on Apr. 26, 2024, 8 pages.
International Search Report and Written Opinion received for PCT Patent Application No. PCT/US23/85816, mailed on Apr. 23, 2024, 11 pages.
International Search Report and Written Opinion received for PCT Patent Application No. PCT/US23/86233, mailed on Apr. 26, 2024, 7 pages.
Kaplan, F. et al, "LoCool: Fighting Hot Spots Locally for System Energy Efficiency" IEEE Transactions on Computer-Aided Design of Intergrated Circuits and Systems, 39(4):895-908 (2020).
U.S. Appl. No. 18/129,567, filed Mar. 31, 2023, First Name Inventor: Cyprian Emeka Uzoh, "Embedded Cooling Systems for Device Packages and Methods of Cooling Packaged Devices".
PCT Application No. PCT/US2024/022253, International Search Report and Written Opinion dated Jul. 17, 2024, 14 pages.
Shamsa, M., et al., "Thermal conductivity of diamond-like carbon films", Applied Physics Letters, vol. 89, No. 16, Oct. 20, 2006, pp. 161921-161921-3.
Wu, C. J., et al., "Ultra High Power Cooling Solution for 3D-Ics", 2021 Symposium on VLSI Technology, Jun. 2021, 2 pages.
"KoolMicro Inc. developed the World's First 2,000 W/cm2 Cooling Technology for High Heat Generation Chips," Press Release, 2 pages, downloaded from www.semiconductorpackagingnews.com/uploads/1/KoolMicro_High_Cooling_Power_Density.pdf on Nov. 22, 2023.
"Single-Phase Direct-to-Chip Liquid Cooling," 6 pages, downloaded from https://jetcool.com/post/single-phase-direct-to-chip-liquid-cooling-microconvective-vs-microchannel-liquid-cooled-cold-plates/ on Mar. 7, 2024.
"Microconvective Liquid Cooling for high power electronics," https://jetcool.com/technology/, downloaded Mar. 7, 2024, 6 pages.
Benson D.A. et al., "Micro-Machined Heat Pipes in Silicon MCM Substrates", Sandia National Laboratories, Sandia Report: SAND97-0100-UC-704, printed Jan. 1997, 17 pages.
International Search Report and Written Opinion mailed Jun. 5, 2024, in International Application No. PCT/US2024/013758, 9 pages.
International Search Report and Written Opinion mailed Mar. 16, 2023, in International Application No. PCT/US2022/050105, 9 pages.
International Search Report and Written Opinion mailed May 30, 2023, in International Application No. PCT/US2023/061494, 9 pages.
Johnstone, Caitlin, "Coolant-on-Chip: Say Goodbye to Thermal Interfaces," jetcool, Jun. 9, 2020, https://jetcool.com/post/coolant-on-chip-say-goodbye-to-thermal-interfaces/, downloaded Feb. 29, 2024, 7 pages.
Walsh, Stephen Michael, "Microjet Impingement Cooling of High Power-Density Electronics," Thesis, submitted May 11, 2018, 93 pages.

* cited by examiner

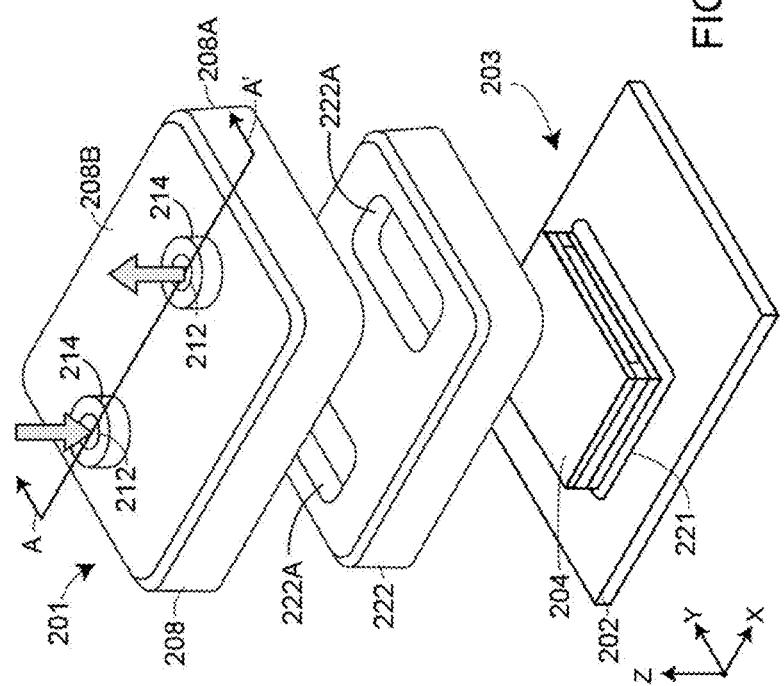

EMBEDDED COOLING SYSTEMS FOR ADVANCED DEVICE PACKAGING AND METHODS OF MANUFACTURING THE SAME

CROSS-REFERENCE TO RELATED APPLICATIONS

This application claims the benefit of U.S. Provisional Patent Application No. 63/550,702 filed Feb. 7, 2024 and U.S. Provisional Patent Application No. 63/575,161 filed Apr. 5, 2024, each of which is hereby incorporated by reference herein in its entirety.

FIELD

The present disclosure relates to advanced packaging for microelectronic devices, and in particular, cooling systems for device packages and methods of manufacturing the same.

BACKGROUND

Energy consumption poses a critical challenge for the future of large-scale computing as the world's computing energy requirements are rising at a rate that most would consider unsustainable. Some models predict that the information, communication and technology (ICT) ecosystem could exceed 20% of global electricity use by 2030, with direct electrical consumption by large-scale computing centers accounting for more than one-third of that energy usage. A significant portion of the energy used by such large-scale computing centers is devoted to cooling, since even small increases in operating temperatures can negatively impact the performance of microprocessors, memory devices, and other electronic components. While some of this energy is expended to operate the cooling systems that are directly cooling the chips (e.g., heat spreaders, heat pipes, etc.), energy consumption/costs for indirect cooling can also be quite staggering. Indirect cooling energy costs include, for example, cooling or air conditioning of data center buildings. Data center buildings can house thousands, to tens of thousands or more, of high performance chips in server racks, and each of those high performance chips is a heat source. An uncontrolled ambient temperature in a data center will adversely affect the performance of the individual chips, and the data center system performance as a whole.

Thermal dissipation in high-power density chips (semiconductor devices/die) is also a critical challenge as improvements in chip performance, e.g., through increased gate or transistor density due to advanced processing nodes, evolution of multi-core microprocessors, etc., have resulted in increased power density and a corresponding increase in thermal flux that contributes to elevated chip temperatures. Higher density of transistors also increases the length of metal wiring on the chips, which generates its own additional thermal flux due to Joule heating of these wires due to higher currents. These elevated temperatures are undesirable as they can degrade the chip's operating performance, efficiency, reliability, and amount of remaining life. Cooling systems used to maintain the chip at a desired operating temperature typically remove heat using one or more heat dissipation devices, e.g., thermal spreaders, heat pipes, cold plates, liquid cooled heat pipe systems, thermal-electric coolers, heat sinks, etc. One or more thermal interface material(s), such as, for example, thermal paste, thermal adhesive, or thermal gap filler, may be used to facilitate heat transfer between the surfaces of a chip and heat dissipation device(s). A thermal interface material(s) (TIM(s)) is any material that is inserted between two components to enhance the thermal coupling therebetween. Unfortunately, the combined thermal resistance of (i) the thermal resistance of interfacial boundary regions between a TIM(s) and the chip and/or the heat dissipation device(s), and (ii) the thermal resistance of a thermal interface material(s) itself can inhibit heat transfer from the chip to the heat dissipation devices, undesirably reducing the cooling efficiency of the cooling system.

Generally speaking, there are multiple components between the heat dissipating sources (i.e., active circuitry) in the chips and the heat dissipation devices, each of which contributes to the system thermal resistance cumulatively along the heat transfer paths and raises chip junction temperatures from the ambient.

Such cooling systems can suffer from reduced cooling efficiency due to the design and manufacture of system components.

Accordingly, there exists a need in the art for improved energy-efficient cooling systems, by reducing system thermal resistance, and methods of manufacturing the same.

SUMMARY

Embodiments herein provide integrated cooling assemblies embedded in advanced device packages. Advantageously, the integrated cooling assemblies comprise cooling channels between stacked semiconductor devices while maintaining a relatively small distance between those devices. Therefore, cooling may be provided directly to two or more stacked semiconductor devices to efficiently cool the devices while maintaining a relatively close distance between the devices for optimum interconnect performance.

One general aspect includes, a device package including an integrated cooling assembly. The integrated cooling assembly includes a semiconductor stack and a cooling channel. The semiconductor stack includes a first semiconductor device and a second semiconductor device stacked vertically above the first semiconductor device. The semiconductor stack further comprises spacers extending between opposing surfaces of the first and second semiconductor devices to space the first semiconductor device away from the second semiconductor device. The spacers and the opposing surfaces of the first and second semiconductor devices collectively define the cooling channel therebetween. The spacers comprise via electrically connecting the first semiconductor device and the second semiconductor device.

Implementations of the device package may include one or more of the following features. In some embodiments, a thickness of the spacers in a direction orthogonal to the opposing surfaces of the semiconductor devices is less than 200 microns. In some embodiments, the cooling channel is a liquid cooling channel and a liquid may flow through the liquid cooling channel. The liquid may comprise water and/or glycol.

Another general aspect includes a device package including an integrated cooling assembly. The integrated cooling assembly includes a semiconductor stack and a cooling channel. The semiconductor stack includes a first semiconductor device and a second semiconductor device stacked vertically above the first semiconductor device. The first semiconductor device includes sidewalls extending upwardly to the second semiconductor to define a cavity volume. The sidewalls, a lower surface of the second semiconductor device facing the cavity volume, and an upper surface of the first semiconductor device collectively define a cooling channel therebetween. The sidewalls comprise via electrically connecting the first semiconductor device and the second semiconductor device.

Another general aspect includes a method of using a device package. The method includes supplying a fluid through a cooling channel to directly cool a semiconductor device.

Another general aspect includes a method of manufacturing a device package. The method includes forming spacers on a first semiconductor device. The method further includes etching the spacers, the first semiconductor device and a second semiconductor device to form via. The method further comprises depositing a conductive material in the via. The method further comprises directly bonding the second semiconductor device to the spacers to form an integrated cooling assembly. The integrated cooling assembly includes a cooling channel formed between the first and second semiconductor devices and electrically connected via formed between the first semiconductor device and the second semiconductor device.

Another general aspect includes a method of manufacturing a device package. The method includes etching a surface of a first semiconductor device to form cavity sidewalls. The method further includes etching the cavity sidewalls, the first semiconductor device and a second semiconductor device to form via. The method further includes depositing a conductive material in the via. The method further comprises directly bonding the second semiconductor device to the cavity sidewalls to form an integrated cooling assembly. The integrated cooling assembly includes a cooling channel formed between the first and second semiconductor devices and electrically connected via formed between the first semiconductor device and the second semiconductor device.

BRIEF DESCRIPTION OF THE DRAWINGS

The above and other objects and advantages of the disclosure will be apparent upon consideration of the following detailed description, taken in conjunction with the accompanying drawings, in which:

FIG. 2C is a schematic exploded isometric view of the device package in FIG. 2B;

Figure 1:
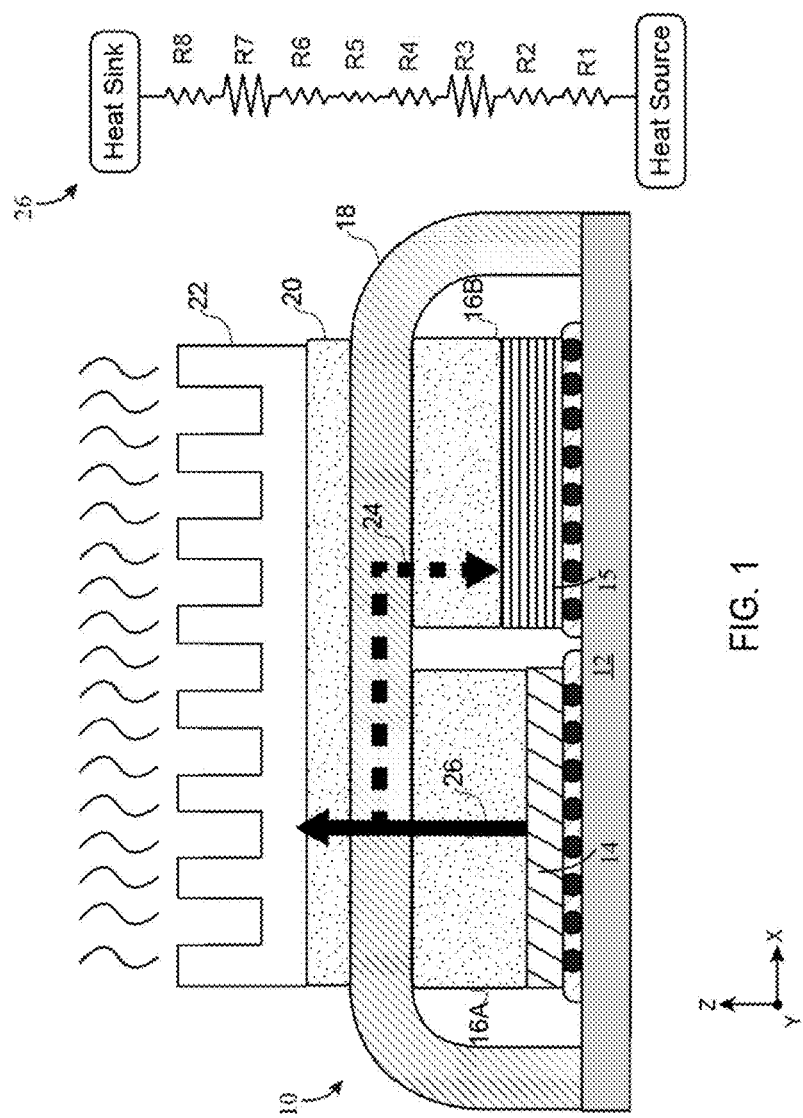
FIG. 1 illustrates a device package with an external heat sink.

The figures herein depict various embodiments of the present disclosure for purposes of illustration only. It will be appreciated that additional or alternative structures, assemblies, systems, and methods may be implemented within the principles set out by the present disclosure.

DETAILED DESCRIPTION

As used herein, the term "substrate" means and includes any workpiece, wafer, or article that provides a base material or supporting surface from which or upon which components, elements, devices, assemblies, modules, systems, or features of the heat-generating devices, packaging components, and cooling assembly components described herein may be formed or mounted. The term "substrate" also includes semiconductor substrates that provide a supporting material upon which elements of a semiconductor device are fabricated or attached, and any material layers, features, and/or electronic devices formed thereon, therein, or therethrough. Examples of substrate material that may be used in applications that generate high thermal density include, but are not limited to, Si, GaN, SiC, InP, GaP, InGaN, AlGaInP, AlGaAs, etc.

As described below, the semiconductor substrates herein generally have a "device side," e.g., the side on which semiconductor device elements are fabricated, such as transistors, resistors, and capacitors, and a "backside" that is opposite the device side. The term "active side" should be understood to include a surface of the device side of the substrate and may include the device side surface of the semiconductor substrate and/or a surface of any material layer, device element, or feature formed thereon or extending outwardly therefrom, and/or any openings formed therein. Thus, it should be understood that the material(s) that forms the active side may change depending on the stage of device fabrication and assembly. Similarly, the term "non-active side" (opposite the active side) includes the non-active side of the substrate at any stage of device fabrication, including the surfaces of any material layer, any feature formed thereon, or extending outwardly therefrom, and/or any openings formed therein. Thus, the terms "active side" or "non-active side" may include the respective surfaces of the semiconductor substrate at the beginning of device fabrication and any surfaces formed during material removal, e.g., after substrate thinning operations. Depending on the stage of device fabrication or assembly, the terms "active sides" and "non-active sides" are also used to describe surfaces of material layers or features formed on, in, or through the semiconductor substrate, whether or not the material layers or features are ultimately present in the fabricated or assembled device. For example, in some instances, the term "active side" is used to indicate a surface of a substrate that will in the future, but does not yet, include semiconductor device elements.

Spatially relative terms are used herein to describe the relationships between elements, such as the relationships between substrates, heat-generating devices, cooling assembly components, device packaging components, and other features described below. Unless the relationship is otherwise defined, terms such as "above," "over," "upper," "upwardly," "outwardly," "on," "below," "under," "beneath," "lower," "top," "bottom" and the like are generally made with reference to the X, Y, and Z directions set forth by X, Y and Z axes in the drawings. Thus, it should be understood that the spatially relative terms used herein are intended to encompass different orientations of the substrate and, unless otherwise noted, are not limited by the direction of gravity. Unless the relationship is otherwise defined, terms describing the relationships between elements such as "disposed on," "embedded in," "coupled to," "connected by," "attached to," "bonded to," and the like, either alone or in combination with a spatially relevant term, include both relationships with intervening elements and direct relationships where there are no intervening elements. Furthermore, the term "horizontal" is generally made with reference to the X-axis direction and the Y-axis direction set forth in the drawings. The term "vertical" is generally made with reference to the Z-axis direction set forth in the drawings.

Various embodiments disclosed herein include bonded structures in which two or more elements are directly bonded to one another without an intervening adhesive (referred to herein as "direct bonding," "direct dielectric bonding," or "directly bonded"). The resultant bonds formed by this technique may be described as "direct bonds" and/or "direct dielectric bonds". In some embodiments, direct bonding includes the bonding of a single material on the first of the two or more elements and a single material on a second one of the two or more elements, where the single material on the different elements may or may not be the same. For example, bonding a layer of one inorganic dielectric (e.g., silicon oxide) to another layer of the same or different inorganic dielectric. As discussed in more detail below, the process of direct bonding (e.g., direct dielectric bonding) provides a reduction of thermal resistance between a semiconductor device and a cold plate. Examples of dielectric materials used in direct bonding include oxides, nitrides, oxynitrides, carbonitrides, and oxycarbonitrides, etc., such as, for example, silicon oxide, silicon nitride, silicon oxynitride, silicon carbonitride, silicon oxycarbonitride, etc. Direct bonding can also include bonding of multiple materials on one element to multiple materials on the other element (e.g., hybrid bonding). As used herein, the term "hybrid bonding" refers to a species of direct bonding having both i) at least one (first) nonconductive feature directly bonded to another (second) nonconductive feature, and ii) at least one (first) conductive feature directly bonded to another (second) conductive feature, without any intervening adhesive. The resultant bonds formed by this technique may be described as "hybrid bonds" and/or "direct hybrid bonds". In some hybrid bonding embodiments, there are many first conductive features, each directly bonded to a second conductive feature, without any intervening adhesive. In some embodiments, nonconductive features on the first element are directly bond to nonconductive features of the second element at room temperature without any intervening adhesive, which is followed by bonding of conductive features of the first element directly bonded to conductive features of the second element via annealing at slightly higher temperatures (e.g., >100° C., >200° C., >250° C., >300° C., etc.) Direct bonding may include direct dielectric bonding techniques as described herein, and may give rise to direct dielectric bonds. Hybrid bonding may include hybrid bonding techniques as described herein, and may give rise to direct hybrid bonds.

Unless otherwise noted, the terms "cooling assembly" and "integrated cooling assembly" generally refer to a semiconductor stack having a cooling channel formed therebetween. Typically, the cooling channel is formed with recessed surfaces that define one or more fluid cavities (e.g., a coolant chamber volume) between a first and second semiconductor devices of the semiconductor stack. Alternatively, the cooling channel may be formed by spacers disposed between opposing surfaces of first and second semiconductor devices to define a cooling channel therebetween. In embodiments where the cooling channel is formed with plural fluid cavities, each fluid cavity may be defined by cavity dividers and/or sidewalls of the cooling channel. For example, cavity dividers may be spaced apart from each other and extend laterally between opposing cooling channel sidewalls (e.g., in one direction between a first pair of opposing cooling channel sidewalls, or in two directions between orthogonal pairs of opposing cold plate sidewalls). The cavity dividers and the cooling channel sidewalls may collectively define adjacent fluid cavities therebetween.

Beneficially, the opposing surfaces of the first and second semiconductor devices are directly exposed to coolant fluids flowing through the integrated cooling assembly, thus providing for direct heat transfer therebetween. Unless otherwise noted, the integrated cooling assemblies described herein may be used with any desired fluid, e.g., liquid, gas, and/or vapor-phase coolants, such as water, glycol, etc.

Exemplary fluids available for use in the various thermal solution embodiments include: water (either purified or deionized), a glycol (e.g., ethylene glycol, propylene glycol), glycols mixed with water (e.g., ethylene glycol mixed with water (EGW) or propylene glycol mixed with water (PGW)), dielectric fluids (e.g. fluorocarbons, polyalphaolefin (PAO), isoparaffins, synthetic esters, or very high viscosity index (VHVI) oils), or mineral oils. Additionally, depending upon design and operating conditions, these fluids may be used in single-phase liquid, single-phase vapor, two-phase liquid/vapor or two-phase solid/liquid. All of these fluids and fluid mixtures will alter the thermohydraulic and heat transfer properties by altering the temperatures where phase change occurs, as well as meeting design temperature and pressure conditions for the component being cooled or warmed and the thermal solution being deployed. Additionally, multiple combinations of the fluid phases may be employed in various hybrid configurations to meet the particular cooling or warming needs of a respective implementation and still be within the scope of the contemplated embodiments.

Additionally, in some embodiments part or all the cooling is provided by gases. Exemplary gases include atmospheric air and/or one or more inert gases such as nitrogen. Atmospheric air may be taken to mean the mixture of different gases in Earth's atmosphere made up of about 78% nitrogen and 210% oxygen.

Depending on the design needs of a thermal solution system using the disclosed embodiments, engineered dielectric cooling fluids may be used. Some examples of dielectric fluids used for cooling semiconductors include: 3M™ Fluorinert™ Liquid FC-40—A non-flammable, dielectric fluid that can be used in direct contact with live electronics; 3M™ Novec™ Engineered Fluids—A non-flammable, dielectric fluid that can be used in direct contact with live electronics; Galden® PFPE (perfluoropolyether) products used as heat transfer fluids; EnSolv Fluoro HTF—A solvent with a high boiling point and low pour point that can be used for semiconductor wafer cooling. It is understood that in the selection of the cooling fluid, system design aspects such as operating temperatures and pressures, fluid flow rates, fluid viscosity, and other properties will require evaluation when selecting the appropriate cooling fluid.

In some embodiments, the cooling fluids may contain microparticles and/or nanoparticle additives to enhance the conductivity of the cooling fluid within the integrated cooling assemblies. Choi and Eastman (1995) from Argonne National Laboratory, U.S.A. (Yu et al., 2007) coined the word "nanofluid". Nanofluids are engineered fluids prepared by suspending the nano-sized (1-100 nm) particles of metals/non-metals and their oxide(s) with a base/conventional fluid. The suspension of high thermal conductivity metals/non-metals and their oxides nanoparticles enhances the thermal conductivity and heat transfer ability, etc. of the base fluid. The additives to the underlying cooling fluid may comprise for example, nanoparticles of carbon nanotube, nanoparticles of graphene, or nanoparticles of metal oxides. When the cooling fluid contains microparticles, the microparticles are typically 10 microns or less in diameter. Silicon oxide microparticles may be used.

The volume concentration of these micro or nanoparticles may be less than 1%, less than 0.2%, or less than 0.05%. Depending upon the liquid and micro/nanoparticle type chosen for the cooling fluid, higher volume concentrations of 10% or less, 5% or less, or 2% or less may be used. The cooling fluids may also contain small amounts of glycol or glycols (e.g. propylene glycol, ethylene glycol etc.) to reduce frictional shear stress and drag coefficient in the cooling fluid within the integrated cooling assembly. The availability of different base fluids (e.g., water, ethylene glycol, mineral or other stable oils, etc.) and different nanomaterials provide a variety of nanomaterial options for nanofluid solutions to be used in the various embodiments. These nanomaterial option groups such as aforementioned metals (e.g., Cu, Ag, Fe, Au, etc.), metal oxides (e.g., TiO2, Al2O3, CuO, etc.), carbons (e.g. CNTS, graphene, diamond, graphite . . . etc.), or a mixture of different types of nanomaterials. Metal nanoparticles (Cu, Ag, Au . . . ), metal oxide nanoparticles (Al2O3, TiO2, CuO), and carbon-based nanoparticles are commonly employed elements. Silicon oxide nanoparticles may also be used. Using cooling fluids with micro and/or nanoparticles when practicing the various embodiments disclosed herein can result in increased heat removal efficiencies and effectiveness.

The fluid control design aspects of specific embodiments may require the nanofluids to be magnetic to facilitate either movement or cessation of movement of the fluids within the semiconductor structures. Magnetic nanofluids (MNFs) are suspensions of a non-magnetic base fluid and magnetic nanoparticles. Magnetic nanoparticles may be coated with surfactant layers such as oleic acid to reduce particle agglomeration and/or settling. Magnetic nanoparticles used in MNFs are usually made of metal materials (ferromagnetic materials) such as iron, nickel, cobalt, as well as their oxides such as spinel-type ferrites, magnetite (Fe3O4), and so forth. The magnetic nanoparticles used in MNFs typically range in size from about 1 to 100 nanometers (nm).

This disclosure describes embodiments involving the architecture of system and component elements that can be employed to provide for the cooling of semi-conductor components, packaging, and boards. However, those skilled in the art will appreciate the disclosed components and arrangements can be deployed and used in scenarios where component heat up or thermal warm up is desired for a component that is currently outside the low end of the desired operational range. Components that are outside the low end of their operational range can, if started in a cold environment, experience thermal warping or cracking up to and including thermal overexpansion and contact separation that may impair the successful operation of the system. Therefore, in these scenarios, the architectures and embodiments disclosed herein can be used where the indirect thermal solutions supporting them are repurposed or operated in a hybrid configuration to provide warming fluids or heat transfer media to accomplish the warm-up or heat-up scenario. These scenarios are controlled by systems not shown here to bring temperatures up at a speed or timing that enables the materials to avoid the excessive thermal expansion or unequal thermal expansion that may occur among the materials of the semiconductor or packaging being serviced by the thermal solution. Once the component or packaging is brought up into the normal operating range, it can be safely started and brought to a useful operational state.

Considering the warm-up or heat-up embodiments introduced above, the balance of this disclosure and terms used should be viewed in a light that also considers the design option for such warm-up or heat-up. Thus, where terms such as cooling channel, cooling chamber volume, and cooling port are used, for example, such terms could also be considered as a thermal control channel, a thermal control volume, or a thermal control port, respectively. A person of skill would understand that heat flux or heat transfer would go in a different direction, but the design concepts are similar and can be successfully employed in the various embodiments.

In some embodiments, a cooling channel is a liquid cooling channel, and a liquid may flow through the liquid cooling channel. In some embodiments, the liquid may comprise a water and/or glycol (e.g., propylene glycol, ethylene glycol, and mixtures thereof).

As described below, coolant fluid flowing through a cold plate may be used to control the temperature of semiconductor devices. The fluid flowing across the surface of the semiconductor device absorbs heat and conducts heat away from the semiconductor device.

FIG. 1 is a schematic side view of a device package 10 and a heat sink 22 attached to the device package 10. The device package 10 typically includes a package substrate 12, a first device 14, a device stack 15, a heat spreader 18, and first TIM layers 16A, 16B thermally coupling the first device 14 and the device stack 15 to the heat spreader 18. The device package 10 is thermally coupled to the heat sink 22 through a second TIM layer 20. The TIM layers 16A, 16B, 20 facilitate thermal contact between components in the device package 10 and between the device package 10 and the heat sink 22.

As heat flux density increases with increasing power density in advanced semiconductor devices, the cumulative thermal resistance of the system illustrated in FIG. 1 is increasingly problematic as heat cannot be dissipated quickly enough to allow semiconductor devices to run at optimal power. Consequently, the energy efficiency of semiconductor devices is reduced. Furthermore, heat is transferred between semiconductor devices within the device package 10, as shown with heat transfer path 24 (illustrated as a dashed line), where heat may be undesirably transferred from the first device 14 having a high heat flux, such as a central processing unit (CPU) or a graphical processing unit (GPU), to the device stack 15 having low heat flux, such as memory, through the heat spreader 18.

For example, as shown in FIG. 1, each device package component and the respective interfacial boundaries therebetween have a corresponding thermal resistance that forms heat transfer path 26 (illustrated by arrow 26 in FIG. 1). The right-hand side of FIG. 1 illustrates the heat transfer path 26 as a series of thermal resistances R1-R8 between a heat source and a heat sink. Here, R1 is the thermal resistance of the bulk semiconductor material of the first device 14. R3 and R7 are the thermal resistances of the first TIM layers 16A, 16B and the second TIM layer 20, respectively. R5 is the thermal resistance of the heat spreader 18. R2, R4, R6, and R8 represent the thermal resistance at the interfacial region of the components (e.g., contact resistances). In a typical cooling system, R3 and R7 may account for 80% or more of the cumulative thermal resistance of the heat transfer path 26, and R5 may account for 5% or more. R1 of the first device 14 and R2, R4, R6, and R8 of the interfaces account for the remaining cumulative thermal resistance. Accordingly, embodiments described herein provide for integrated cooling assemblies embedded within a device package. The embedded cooling assemblies shorten the thermal resistance path between a semiconductor device and a heat sink and reduce thermal communication between semiconductor devices disposed in the same device package, such as described in relation to the figures below.

Figure 2A:
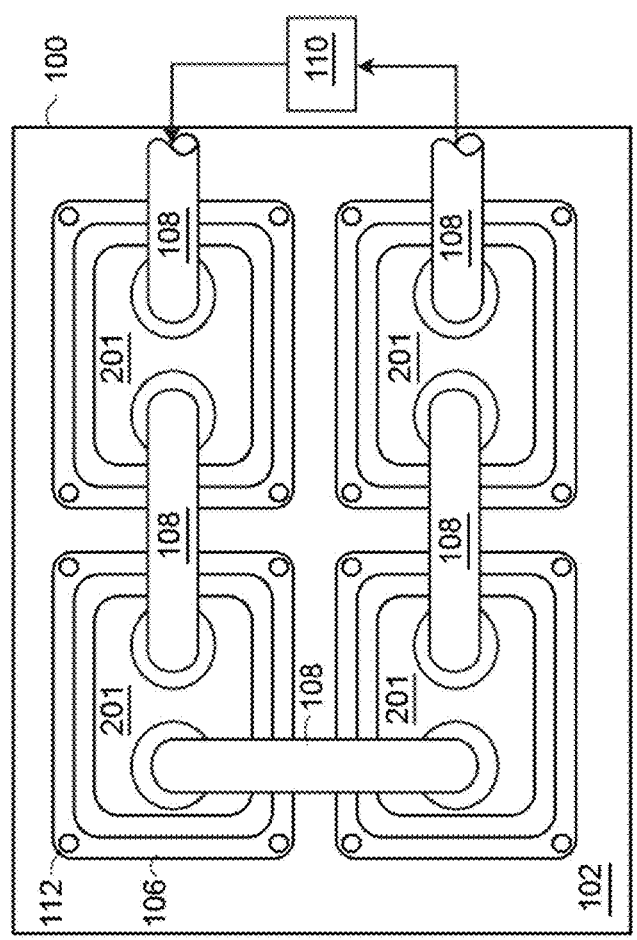
FIG. 2A is a schematic plan view of an example of a system panel, in accordance with embodiments of the present disclosure.

FIG. 2A is a schematic plan view of an example of a system panel 100, in accordance with embodiments of the present disclosure. Generally, the system panel 100 includes a printed circuit board (PCB) 102, a plurality of device packages 201 mounted to the PCB 102, and a plurality of coolant lines 108 fluidly coupling each of the device packages 201 to a coolant source 110. It is contemplated that coolant fluid may be delivered to each of the device packages 201 in any desired fluid phase, e.g., liquid, vapor, gas, or combinations thereof, and may flow out from each device package 201 in the same phase or a different phase. In some embodiments, the coolant fluid is delivered to the device packages 201 and returned therefrom as a liquid, whereby the coolant source 110 may comprise a heat exchanger or chiller to maintain the coolant fluid at a desired temperature. In other embodiments, the coolant fluid may be delivered to the device packages 201 as a liquid, vaporized to a vapor within the device packages 201, and returned to the coolant source 110 as a vapor. In those embodiments, the device packages 201 may be fluidly coupled to the coolant source 110 in parallel, and the coolant source 110 may include or further include a compressor (not shown) for condensing the received vapor to a liquid form.

Figure 2B:
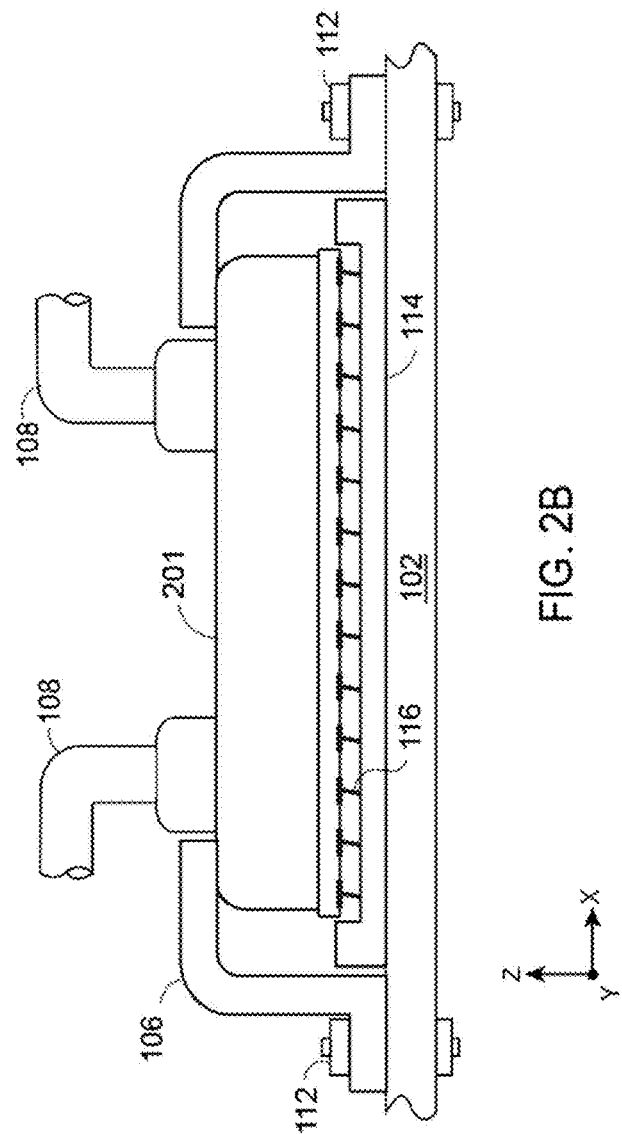
FIG. 2B is a schematic partial sectional side view of a device package mounted on a PCB, in accordance with embodiments of the present disclosure.

FIG. 2B is a schematic partial sectional side view of a portion of the system panel 100 of FIG. 2A. As shown, each device package 201 is fluidly coupled to the plurality of coolant lines 108 and is disposed in a socket 114 of the PCB 102 and connected thereto using a plurality of pins 116, or by other suitable connection methods, such as solder bumps (not shown). The device package 201 may be seated in the socket 114 and secured to the PCB 102 using a mounting frame 106 and a plurality of fasteners 112, e.g., compression screws, collectively configured to exert a relatively uniform downward force on the upward facing edges of the device package 201. The uniform downward force ensures proper pin contact between the device package 201 and the socket 114.

FIG. 2C is a schematic exploded isometric view of an example device package 201, in accordance with embodiments of the present disclosure. Generally, the device package 201 includes a package substrate 202, an integrated cooling assembly 203 disposed on the package substrate 202, and a package cover 208 disposed on a peripheral portion of the package substrate 202. Suitable materials that may be used in the package cover 208 include copper, aluminum, metal alloys, etc. The package cover 208 extends over the integrated cooling assembly 203 so that the integrated cooling assembly 203 is disposed between the package substrate 202 and the package cover 208. The integrated cooling assembly 203 typically includes a semiconductor stack 204 having a cooling channel formed therebetween.

As shown, the device package 201 further includes a sealing material layer 222 that forms a coolant fluid impermeable barrier between the package cover 208 and the integrated cooling assembly 203 that prevents leaking of the coolant fluid outside of the cooling assembly and prevents coolant fluid from reaching an active side 218 (discussed below in relation to FIG. 2D) of the semiconductor stack 204 and causing damage thereto. In some embodiments, the sealing material layer 222 comprises an adhesive material that reliably attaches the package cover 208 to the integrated cooling assembly 203. In some embodiments, the sealing material layer 222 comprises a polymer or epoxy material that extends upwardly from the package substrate 202 to encapsulate and/or surround at least a portion of the semiconductor stack 204. In some embodiments, the sealing material layer 222 may also comprise conductive material, e.g., solder. In other embodiments, the sealing material layer 222 is formed from a molding compound, e.g., a thermoset resin, that when polymerized, forms a hermetic seal between the package cover 208 and the integrated cooling assembly 203. Here, the coolant fluid is delivered to the integrated cooling assembly 203 through openings 222A disposed through the sealing material layer 222. As shown, the openings 222A are respectively in registration and fluid communication with inlet and outlet openings 212 of the package cover 208 thereabove and the inlet and outlet openings in the integrated cooling assembly 203 therebelow. In some embodiments, the device package 201 may further include a support member 207 attached to the integrated cooling assembly 203, as illustrated in FIG. 2D.

It will be understood that the openings are shown in a section view. The openings may have any cross-sectional shape that allows fluid to flow therethrough (e.g., rectangular, square, hexagonal or circular cross-sections). For example, the openings 222A disposed through the sealing material layer 222 may form an elongated shape extending from one side of the sealing material 222 to another side of the sealing material 222. For example, the openings 222A may form any shape having a length greater than a width in the X-Y plane (e.g., a rectangular or a trapezoidal shape). Furthermore, it will be understood that all references to an opening throughout the present disclosure refer to an opening defined by a sidewall (e.g., opening sidewall).

Generally, the package substrate 202 includes a rigid material, such as an epoxy or resin-based laminate, that supports the integrated cooling assembly 203 and the package cover 208. The package substrate 202 may include conductive features disposed in or on the rigid material that electrically couples the integrated cooling assembly 203 to a system panel, such as the PCB 102.

Figure 2D:
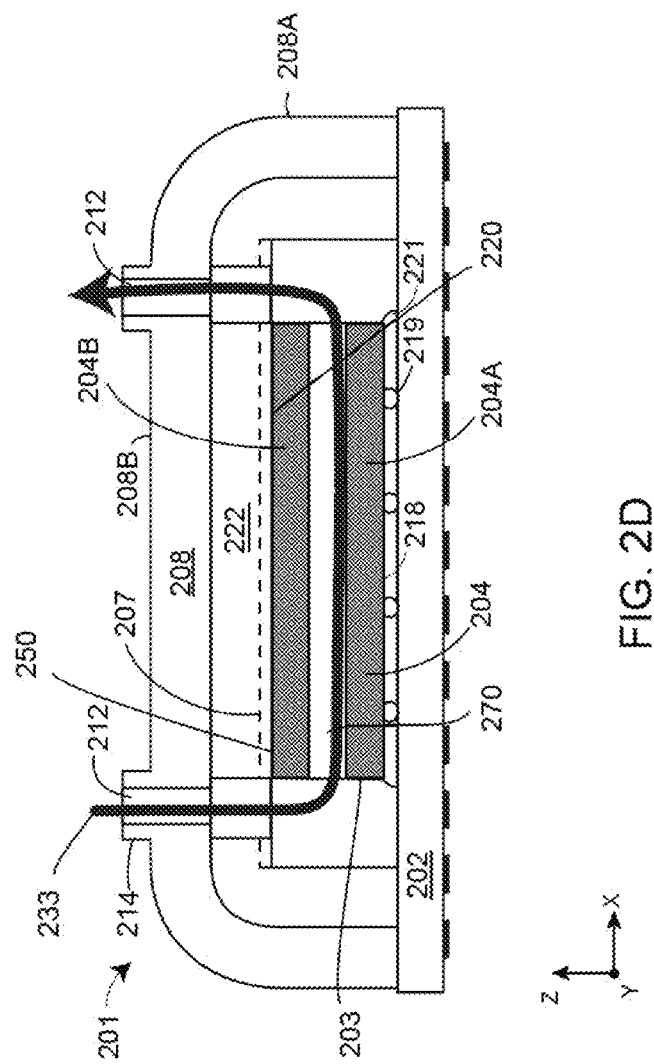
FIG. 2D is a schematic sectional view of an example device package, in accordance with embodiments of the present disclosure, that may be used with the system panel.

FIG. 2D is a schematic sectional view in the X-Z plane of the device package 201 taken along line A-A' of FIG. 2C. As illustrated in FIG. 2D, the integrated cooling assembly 203 typically includes a semiconductor stack, here stack 204. Here, the semiconductor stack 204 comprises plural semiconductor devices stacked vertically (in the Z-axis direction). Adjacent semiconductor devices comprise aligned and attached surfaces. For example, a frontside of a second semiconductor device is aligned and attached to a backside of an underlying first semiconductor device. Each semiconductor device in the semiconductor stack 204 includes an active side 218 that includes device components, e.g., transistors, resistors, and capacitors, formed thereon or therein, and a non-active side, here the semiconductor device backside 220, opposite the active side 218. As shown, the active side 218 is positioned adjacent to and facing towards the package substrate 202. The active side 218 may be electrically connected to the package substrate 202 by use of conductive bumps 219, which are encapsulated by a first underfill layer 221 disposed between the integrated cooling assembly 203 and the package substrate 202. The first underfill layer 221 may comprise a cured polymer resin or epoxy, which provides mechanical support to the conductive bumps 219 and protects against thermal fatigue. In some embodiments, the active side 218 may be electrically connected to another package substrate, another active die, or another passive die (e.g., interposer) using hybrid bonding or conductive bumps 219. The integrated cooling assembly 203 may be disposed on the package substrate 202 with a bottom semiconductor device (e.g., of a device stack) attached to the package substrate 202 (e.g., a frontside of the bottommost semiconductor device in the stack 204 is attached to the substrate 202).

Figure 2E:
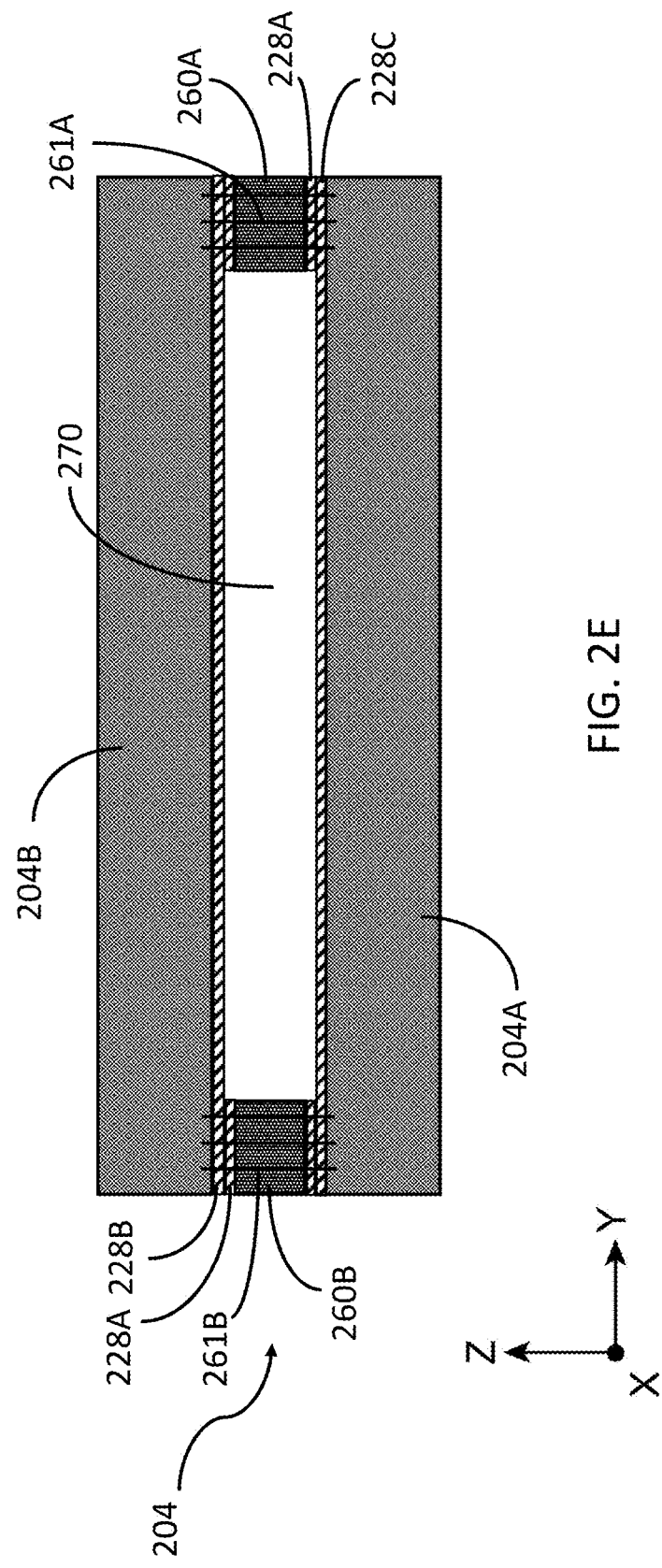
FIG. 2E is a schematic sectional view of an example semiconductor stack, in accordance with embodiments of the disclosure.

FIG. 2E is a schematic cross-sectional view of the semiconductor stack 204 in Z-Y plane of FIG. 2C. The semiconductor stack 204 may comprise a first semiconductor device 204A and a second semiconductor device 204B stacked vertically above the first semiconductor device 204A. The semiconductor stack 204 may comprise spacers 260A, 260B extending between opposing surfaces of the first and second semiconductor devices to space the first semiconductor device 204A away from the second semiconductor device 204B.

The spacers 260A, 260B may be formed of any suitable material that has sufficient structural strength to withstand the desired pressures of coolant flowing therethrough. For example, the spacers 260A, 260B may be formed of semiconductor material like silicon or other engineered materials like glass. For example, the spacers 260A, 260B may be formed of a material selected from a group comprising polymers, metals, ceramics, or composites thereof. In some embodiments, the spacers 260A, 260B may be formed of stainless steel (e.g., from a stainless steel metal sheet) or a sapphire plate. In some embodiments, the spacers 260A, 260B may be formed of a material having a substantially different coefficient of thermal expansion (CTE) from the the bulk material of the substrate 202 and/or semiconductor devices of the stack 204, e.g., a CTE mismatched material. where the CTE is a fractional change in length of the material (in the X-Y plane) per degree of temperature change. In such embodiments, the spacers 260A, 260B may be attached between semiconductor devices by a compliant adhesive layer (not shown) or a molding material that absorbs the difference in expansion between the spacers 260A, 260B and semiconductor devices across repeated thermal cycles. In some embodiments, the CTEs of the spacers 260A, 260B, the substrate 202, and/or the semiconductor stack 204 are matched so that the CTE of the substrate 202 and/or the semiconductor stack 204 is within about +/−20% or less of the CTE of the spacers 260A, 260B, such as within +/−15% or less, within +/−10% or less, or within about +/−5% or less when measured across a desired temperature range. In some embodiments, the CTEs are matched across a temperature range from about −60° C. to about 100° C. or from about −60° C. to about 175° C. In one example embodiment, the matched CTE materials each include silicon.

The spacers 260A, 260B may be attached between opposing surfaces of the first and second semiconductor devices 204A, 204B without the use of an intervening adhesive material, e.g., the spacers 260A, 260B may be directly bonded, such that the spacers 260A, 260B, the backside of the first semiconductor device and the frontside of the second semiconductor device (i.e. opposing surfaces of the first and second semiconductor devices 204A, 204B) are in direct thermal contact. For example, in some embodiments, one or all of the spacers 260A, 260B, the backside 220 of the first semiconductor device and the frontside 218 of the second semiconductor device may comprise a dielectric material layer, and the spacers 260A, 260B are directly bonded to the opposing surfaces of the first and second semiconductor devices 204A, 204B through bonds formed between the dielectric material layers. In some embodiments, one of the spacers 260A, 260B or the opposing surfaces of the first and second semiconductor devices 204A, 204B may comprise a thin bonding dielectric layer (e.g., silicon nitride, etc.) and other element(s) may not include any such explicit bonding dielectric layer (or can have only a native oxide layer). For example, a first dielectric material layer 228A may be disposed on upper surfaces of the spacers 260A, 260B which face the second device frontside, and a second dielectric material layer 228C may be disposed on lower surfaces of the spacers 260A, 260B which face the first device backside. Furthermore, a third dielectric material layer and a fourth dielectric material layers 228B may be disposed on the second device frontside and the first device backside, respectively. The dielectric material layers 228A, 228B, 228C may be continuous or non-continuous. In embodiments where the spacers are formed on a surface of a semiconductor device using lithography, only one surface of the spacers 260A, 260B has a dielectric material layer disposed thereon and only one device side has a dielectric material layer disposed thereon. The spacers 260A, 260B may subsequently be directly bonded to the backside of the first semiconductor device and/or the frontside of the second semiconductor device through bonds formed between the dielectric material layers.

In some embodiments, the backside of the first semiconductor device 204A may be etched to form cavity sidewalls to define the cooling channel. In such embodiments, the spacers 260A, 260B will be replaces by the cavity sidewalls, and the second semiconductor device is directly bonded to upper surfaces of the cavity sidewalls using dielectric material layers, as discussed above.

The spacers 260A, 260B may be attached between devices using a hybrid bonding technique, where bonds are formed between the dielectric material layers and between metal features, such as between first metal pads and second metal pads, disposed in the dielectric material layers 228A, 228B, 228C. In some embodiments, the metal pads may be upper portions of electrically conductive via.

Beneficially, directly bonding the spacers 260A, 260B to the opposing surfaces of the first and second semiconductor devices 204A, 204B, as described above, reduces the thermal resistance therebetween and increases the efficiency of heat transfer from the semiconductor devices 204A, 204B to the spacers 260A, 260B.

Suitable dielectrics that may be used as the dielectric material layers 228A, 228B, 228C include silicon oxides, silicon nitrides, silicon oxynitrides, silicon carbon nitrides, metal-oxides, metal-nitrides, silicon carbide, silicon oxycarbides, silicon oxycarbonitride, silicon carbonitride, diamond-like carbon (DLC), or combinations thereof. In some embodiments, one or both of the dielectric material layers are formed of an inorganic dielectric material, e.g., a dielectric material substantially free of organic polymers. Typically, one or both of the dielectric layers are deposited to a thickness greater than the thickness of a native oxide, such as about 1 nanometer (nm) or more, 5 nm or more, 10 nm or more, 50 nm or more, 100 nm or more, or 100 nm or more. In some embodiments, the one or both of the layers are deposited to a thickness of 300 nm or less, such as 100 nm or less, 100 nm or less, or 50 nm or less.

The spacers 260A, 260B and the opposing surfaces of the first and second semiconductor devices collectively define a cooling channel 270 therebetween. Here, an inlet opening and an outlet opening are formed between sidewalls of the spacers 260A, 260B and the opposing surfaces of the semiconductor devices, as discussed in more detail below. The cooling channel 270 may be in fluid communication with the inlet opening and the outlet opening. The spacers 260A, 260B comprise vias 261A and 261A respectively, electrically connecting the first semiconductor device 204A and the second semiconductor device. It should be appreciated that in other embodiments only one of the spacers 260A 260B may comprise vias. As discussed in more detail below, the via may be formed through the spacers using lithography in order to create conductive channels between which the first and second semiconductor devices may transmit signals. The first semiconductor device 204A may comprise one or more electronic components with a relatively high power dissipation rate, such as a computational core, neural core or graphical processing unit. The second semiconductor device 204B may comprise one or more electronic components with a relatively low power dissipation rate, such as a memory unit, I/O unit, PHY unit or analog unit.

The package cover 208 generally comprises one or more vertical or sloped sidewall portions 208A and a lateral portion 208B that spans and connects the sidewall portions 208A. The sidewall portions 208A may extend upwardly from a peripheral surface of the package substrate 202 to surround the integrated cooling assembly 203 disposed thereon. The lateral portion 208B may be disposed over the integrated cooling assembly 203 and is typically spaced apart from the integrated cooling assembly 203 by a gap corresponding to the thickness of the sealing material layer 222. Coolant is circulated through the cooling channel 270 through the package cover inlet/outlet openings 212 formed through the lateral portion 208B. The inlet and outlet openings of the integrated cooling assembly 203 may be in fluid communication with the inlet and outlet openings of the package cover 208 through openings formed in the sealing material layer disposed therebetween. In each of the embodiments described herein, coolant lines 108 may be attached to the device package 201 by use of connector features formed in the package cover 208, such as threads formed in the sidewalls of the package cover inlet/outlet openings 212 and/or protruding features 214 that surround the openings 212 and extend upwardly from a surface of the lateral portion 208B.

Typically, the package cover 208 is formed of semi-rigid or rigid material so that at least a portion of the downward force exerted on the package cover 208 by the mounting frame is transferred to a supporting surface of the package substrate 202 and not transferred to the semiconductor stack 204 therebelow. In some embodiments, the package cover 208 is formed of a thermally conductive metal, such as aluminum or copper. In some embodiments, the package cover 208 functions as a heat spreader that redistributes heat from one or more electronic components within a multi-component device package, such as described below.

With reference to FIG. 2E, the spacers 260A, 260B may comprise a thickness in a direction orthogonal to the opposing surfaces of the semiconductor devices (i.e. Z-axis direction in FIG. 2D) that is less than 200 µm. In another embodiment the thickness may be less than or equal to 100 µm. This may be advantages in that an impedance and a pitch size of the vias 261A, 261B may be reduced and the density of the vias can be increased. The increased density may be beneficial for I/O connections.

In some embodiments, the opposing surfaces of the first and second semiconductor devices 204A, 204B comprises a corrosion protective layer (not shown). The corrosion protective layer may be a continuous layer disposed across the entire surfaces of the first and second semiconductor devices 204A, 204B. Beneficially, the corrosion protective layer provides a corrosion-resistant barrier layer, thus preventing undesired corrosion of the first and second semiconductor devices 204A, 204B (e.g., the semiconductor substrate material which might otherwise be in direct contact with coolant fluid flowing through a cooling channel 270).

In some embodiments, a height in the Z-axis direction of the cooling channel 270 may be greater than 100 µm, 100 µm-1000 µm, or 100 µm-700 µm. A width in the Y-axis direction of the cooling channel 270 may be greater than 100 µm, 100 µm-1000 µm, or 100 µm-700 µm. For example, the width of the cooling channel 270 may be greater than the height. A cross-section of the coolant chamber volume(s) and/or coolant channel(s) in the Y-Z plane is wide enough to allow for a pressure drop of 0-20 psi, 3-15 psi, or 4-10 psi.

Figure 3:
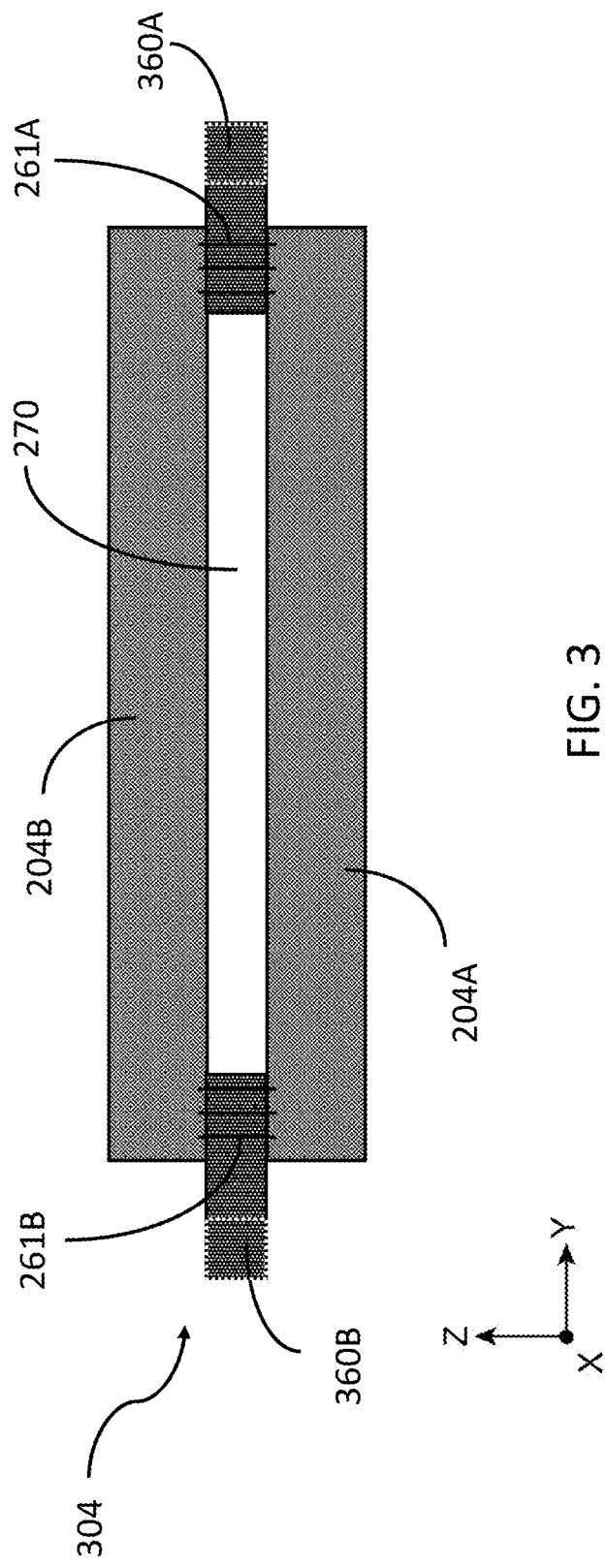
FIG. 3 is a schematic sectional view of an example semiconductor stack, in accordance with embodiments of the disclosure.

FIG. 3 is a schematic cross-sectional view of a semiconductor stack 304 according to another embodiment. The semiconductor stack 304 is similar to the semiconductor stack 204 and thus the same elements of the semiconductor stack 304 has been given the same reference numeral as the semiconductor stack 204. The description of these elements are not repeated for conciseness. The semiconductor stack 304 differs from the semiconductor stack 204 in that the spacers 360A, 360B form portions of an interposer. The interposer from which the spacers 360A, 360B are formed may extend laterally beyond vertical sidewalls of the semiconductor stack 304 (as illustrated by the dashed lines in FIG. 3) to connect devices of the semiconductor stack 204 to additional electronic components, circuits or chips. An interposer may be taken to be a thin, flat substrate usually made from silicon or organic material, that serves as an intermediary between multiple semiconductor devices, or dies, allowing them to communicate and function together. Interposers acts as a bridge, connecting the semiconductor devices' electrical, signal, and power pathways.

Figure 4:
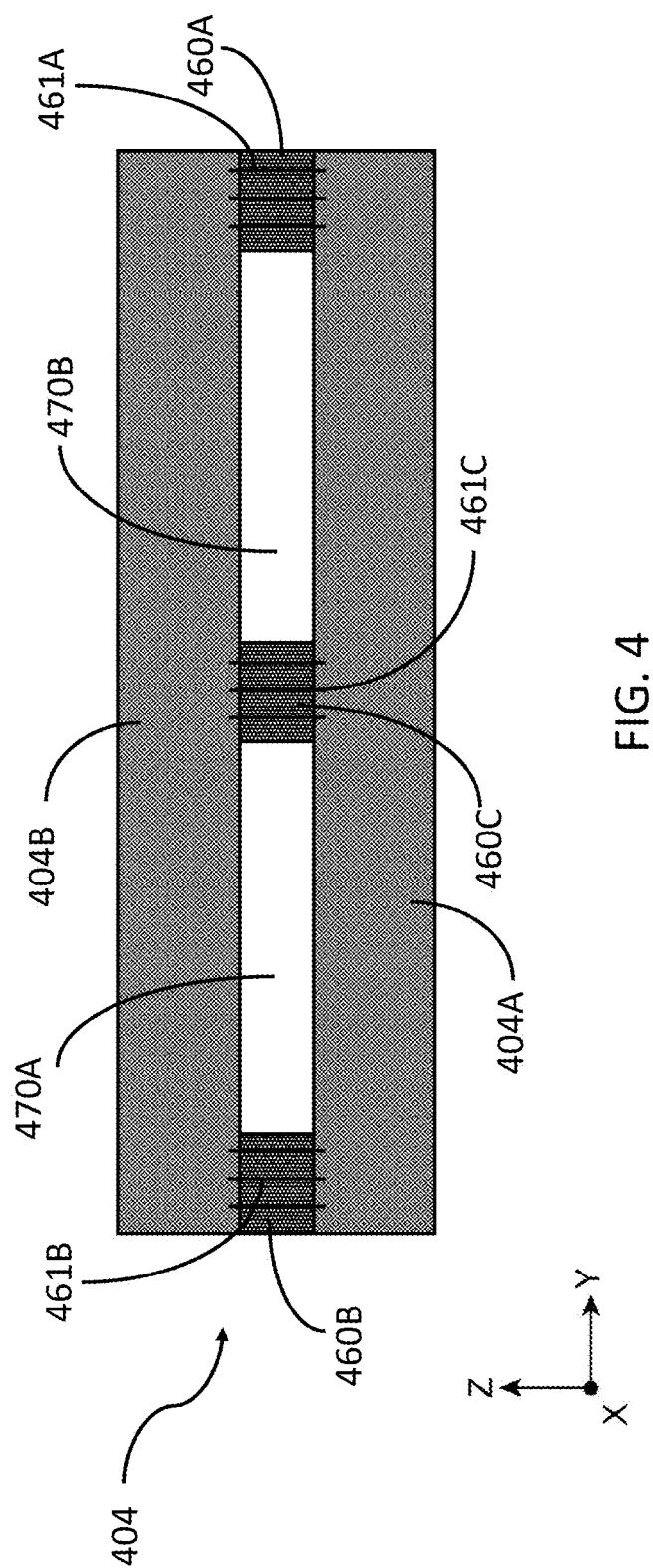
FIG. 4 is a schematic sectional view of an example semiconductor stack, in accordance with embodiments of the disclosure.

FIG. 4 is a schematic cross-sectional view of a semiconductor stack 404 according to another embodiment. The semiconductor stack 404 may comprise a first semiconductor device 404A and a second semiconductor device 404B stacked vertically above the first semiconductor device. The semiconductor stack 404 may comprise first, second and third spacers 460A, 460C, 460C extending between opposing surfaces of the first and second semiconductor devices 404A, 404B to space the first semiconductor device 404A away from the second semiconductor device 404B. The first spacer 460A and the third spacer 460B are disposed on opposing edges of the first and second semiconductor devices 404A, 404B. That is, the semiconductor devices are rectangular in shape having a first pair of parallel opposing edges and a second pair of parallel opposing edges disposed orthogonally to the first pair. The first and third spacers 460A, 460B may therefore be disposed along the first pair of parallel opposing edges or the second pair of opposing parallel edges. The second spacer 460C is disposed across centrally aligned regions of the first semiconductor device 404A and the second semiconductor device 404B. For example, the second spacer 460C may be disposed between the first and third spacers 460A, 460B (e.g., at an equal distance from each of the first and third spacers 460A, 460B). The first and second spacers 460A, 460C in combination with adjacent portions of the opposing surfaces of the first and second semiconductor devices 404A, 404B above and below the first and second spacers 460A, 460C collectively define a first cooling channel 470A therebetween. The second and third spacers 460B, 460C in combination with adjacent portions of the opposing surfaces of the first and second semiconductor devices 404A, 404B positioned between the second and third spacers 460B, 460C collectively define a second cooling channel 470B therebetween. The first, second and third spacers 460A, 460B, 460C comprise vias 461A, 461B, 461C respectively, and the vias 461A, 461B, 461B electrically connect the first semiconductor device 404A and the second semiconductor device 404B. It should be appreciated that in other embodiments, one or more of the spacers 460A, 460B, 460C may not comprise vias. It should also be appreciated that here, the spacers are illustrated as each comprising three vias. However, it will be understood that the spacers may each comprise fewer vias, and in some embodiments each spacer may comprise a single via.

In some embodiments, the semiconductor stack 404 may comprise more than three spacers disposed between opposing surfaces of semiconductor devices. For example the semiconductor stack 404 may comprise four spacers, five spacers or more. Furthermore, the semiconductor stack 404 may comprise more than two cooling channel formed between the spacers, for example three cooling channels or four cooling channels or more. This may advantageous because the surface area contacting the coolant fluid may be increased. Furthermore, additional spacers may provide increased structural support.

In some embodiments, one or more of the spacers may not be disposed at equal distances along the width of semiconductor stack 404 (i.e in Y-axis direction in FIG. 2B). For example a distance between a first spacer and a second spacer may be smaller than a distance between the second spacer and the third spacer. In this manner, a cooling channel formed between the first spacer and the second spacer may have a narrower width than a cooling channel formed between the second spacer and the third spacer. This may allow a larger portion of a coolant fluid to be directed to an area of the semiconductor stack 404 having a higher heat dissipation power, as one example.

Figure 5:
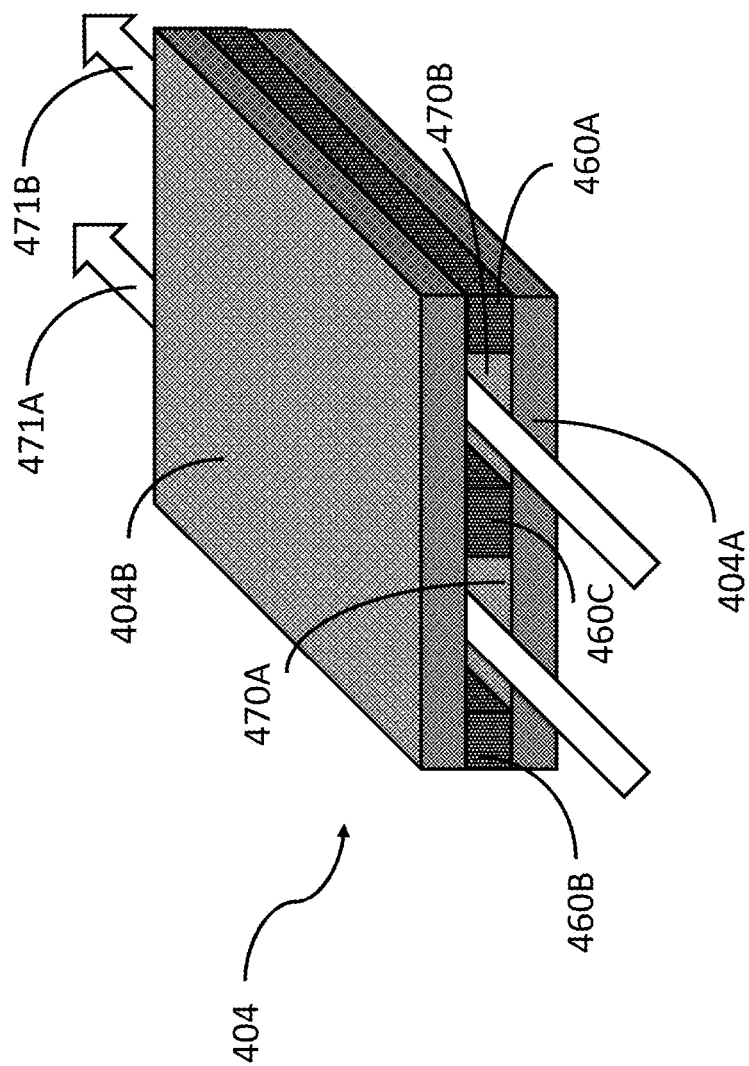
FIG. 5 is a perspective view of a semiconductor stack according to an embodiment.

FIG. 5 illustrates a perspective view of the semiconductor stack 404 according to an embodiment. First and second arrows 471A, 471B show the direction of coolant fluid paths through respective first and second cooling channels 470A, 470B. In some embodiments, the coolant fluid paths may be part of the same coolant loop. Alternatively, in another embodiment, each of the fluid paths may be part of a different coolant loop.

The spacers discussed in relation to the present embodiments may comprise a width of less than 500 microns in a direction parallel to the opposite surfaces of the semiconductor devices 404A and 404B (i.e. Y-axis direction in FIG. 2B). A height of the cooling channel may be defined by a thickness of the spacers in a direction orthogonal to the opposite surfaces of the semiconductor devices 404A and 404B (i.e. in Z-axis direction in FIG. 2B). In some embodiments, the width to height aspect ratio of the cooling channel may be 100 to 1 (100:1). This may be advantageous because a cooling channel with relatively wide aspect ratios (e.g., channel cross-section having a large width and a small height) ensures relatively high fluid pressure is maintained for a cooling liquid flowing therethrough.

TABLE 1

| Part | L(mm) | W (mm) | t (mm) | Die Surface Area | Power (W) | Power Density (W/mm$^2$) |
|---|---|---|---|---|---|---|
| Top Die | 10 | 10 | 0.5 | 100 | 12 | 0.12 |
| Spacers | 10 | 0.5 | 0.1 | | | |
| Bottom Die | 10 | 10 | 0.5 | 100 | 50 | 0.50 |

Table 1 presented above provides exemplary parameters for a semiconductor stack similar to the semiconductor stack 404 shown in FIG. 4A, which include three spacers. In the above table, "L" represents length, "W" represents width and "t" represents thickness of the top die (for example the second semiconductor device 404B), bottom die (for example the first semiconductor device 404A) or the spacers (for example the spacers 460A, 460B and 460C). Power is the output power associated with each die when operational and the power density is the output per unit surface area. In this embodiment, the width to height aspect ratio of the cooling channels is 42.5 to 1 (42.5:1). As will be understood from Table 1, this is because the width of the top die and the bottom die is 10 mm and each of the spacers has a width of 0.5 mm. There are three spacers which means 1.5 mm of the total width is taken by the spacers and 8.5 mm of the total width forms cooling channels between the spacers when the spacers are arranged similar to the semiconductor stack 404 shown in FIG. 4A. Therefore each cooling channel has a width of 4.25 mm and a height of 0.1 mm (spacers height) resulting in a width to height aspect ration of 42.5:1. In some embodiments, the width to height aspect ratio of the cooling channel may be 100 to 1 (100:1).

Figure 6:
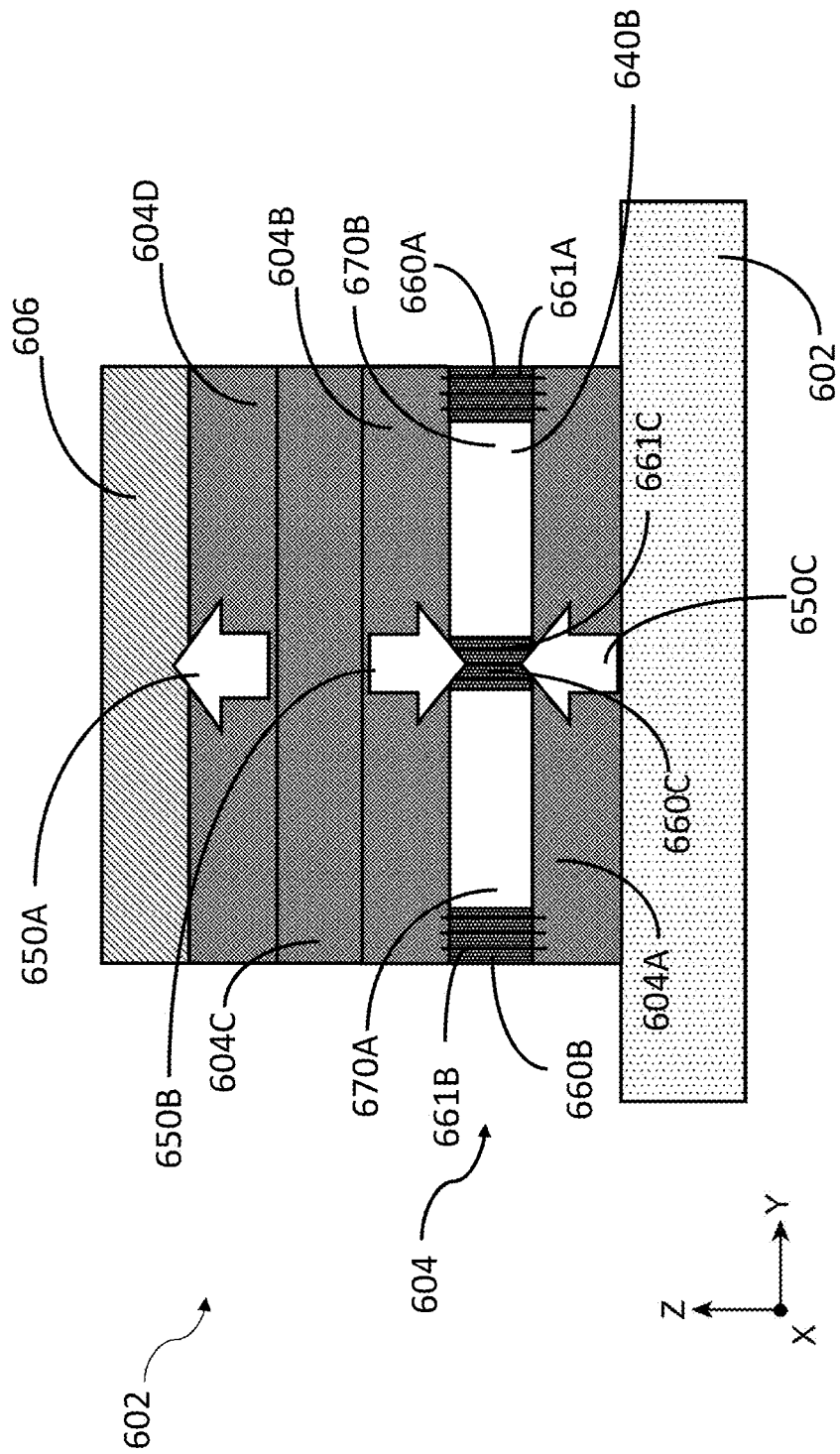
FIG. 6 is a schematic sectional view of an example semiconductor stack, in accordance with embodiments of the disclosure.

FIG. 6 is a schematic cross-sectional view of an integrated cooling assembly 603 according to an embodiment. The cooling assembly 603 may comprise a semiconductor stack 604 disposed on a substrate 602 and a heat sink 606 disposed on the semiconductor stack 604. The semiconductor stack 604 may comprise a first semiconductor device 604A, a second semiconductor device 604B, a third semiconductor device 604C and a fourth semiconductor device 604D, each of which are stacked vertically above one another to form a three dimensional (3D) semiconductor stack. The semiconductor stack 604 may comprise first, second and third spacers 660A, 660C, 660B extending between opposing surfaces of the first and second semiconductor devices to space the first semiconductor device 604A away from the second semiconductor device 604B. In a similar manner to the embodiment discussed in relation to FIG. 4A, the first and third spacers 660A, 660B are disposed on opposing sides of the first and second semiconductor devices 604A, 604B, and the second spacer 660C is disposed across centrally aligned regions of the first semiconductor device 604A and the second semiconductor device 604B. The first and second spacers 660A and 660C and adjacent portions of the opposing surfaces of the first and second semiconductor devices collectively define a cooling channel 670A. The second and third spacers 660B, 660C and adjacent portions of the opposing surfaces of the first and second semiconductor devices collectively define a cooling channel therebetween 670B. The first, second and third spacers 660A, 660B and 660C comprise first, second and third vias 661A, 661B, 661C respectively, which electrically connect the first semiconductor device 604A and the second semiconductor device 604B. It should be appreciated that in other embodiments, one or more of the spacers 660A, 660B and 660C may not comprise vias. In some embodiment, only the second spacer 660C being disposed across centrally aligned regions of the first semiconductor device 604A and the second semiconductor device 604B comprises visas.

Arrows 650A. 650B and 650C show the direction in which a majority of heat produced by the semiconductor devices 604A-604C may propagate. The majority of heat generated by the semiconductor devices 604A and 604B may propagate towards and be transferred to the cooling channels 670A and 670B, whereas the majority of heat generated by the semiconductor devices 604C and 604D may propagate and may be transferred to the heat sink 606. In this manner, the heat generated in all layers of the semiconductor stack 604 is effectively removed.

In some embodiments, an integrated cooling assembly comprising a semiconductor stack according to any previous embodiments may further comprise an inlet opening and an outlet opening disposed between the spacers and the cooling channel may be in fluid communication with the inlet opening and the outlet opening. In some embodiments, a semiconductor stack according to any previous embodiments comprises a first spacer comprising an inlet opening and a second spacer comprising an outlet opening, and the cooling channel is in fluid communication with the inlet opening and the outlet opening. That is, the inlet opening may be formed within the first spacer and the outlet opening may be formed in the second spacer (e.g., by patterning the spacers and etching the respective openings). Here, the semiconductor stack 604 is illustrated as having four semiconductor devices 604B-604E disposed above the cooling channel 670B and one semiconductor device 604A disposed below the cooling channel 670B. However, it will be understood that any number of semiconductor devices may be provided above and/or below the cooling channel 670B. For example, plural semiconductor devices may be provides below the cooling channel 670B and a single semiconductor device may be provided above the cooling channel 670B. Alternatively, plural semiconductor devices may be provided both above and below the cooling channel 670B. This may facilitate extracting heat (i.e. thermal energy) from between semiconductor devices lower down in the semiconductor stack which would otherwise be difficult to cool. Additionally providing a cooling channel between semiconductor devices in a semiconductor stack while minimizing height of the cooling channel allows vias to be formed in the spacers with relatively short lengths for optimum performance.

Figure 7:
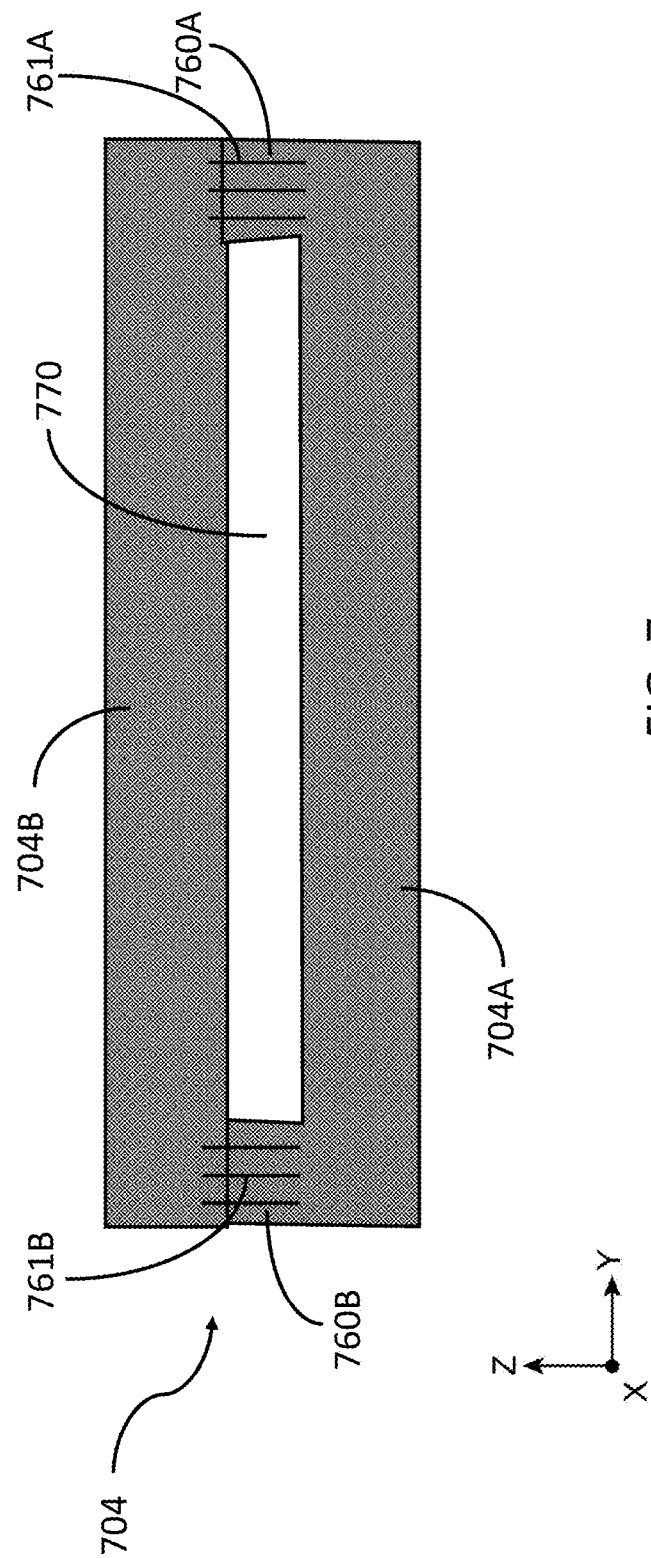
FIG. 7 is a schematic sectional view of an example semiconductor stack, in accordance with embodiments of the disclosure.

FIG. 7 is a schematic cross-sectional view of a semiconductor stack 704 according to an embodiment of present disclosure. The semiconductor stack 704 may comprise a first semiconductor device 704A and a second semiconductor device 704B stacked vertically above the first semiconductor device 704A. The first semiconductor device 704A may comprise first and second sidewalls 760A, 760B extending upwardly to the second semiconductor 704B to define a cavity volume. It will be understood that the first and second sidewalls may form portions of a single sidewall which extends around a perimeter of the first semiconductor device 704A. The first and second sidewalls 760A, 760B, a lower surface (e.g., frontside) of the second semiconductor device 704B facing the cavity volume, and an upper surface (e.g., backside) of the first semiconductor device 704A collectively define the cooling channel 770 therebetween. The sidewalls 760A and 760B may comprise vias 761A, 761B electrically connecting the first semiconductor device 704A and the second semiconductor device 704B. The first semiconductor device 704A may comprise one or more electronic components with a relatively high power dissipation rate, such as a computational core, neural core or graphical processing unit. The second semiconductor device 704A may comprise one or more electronic components with a relatively low power dissipation rate, such as a memory unit, I/O unit, PHY unit or analog unit. Therefore, the cooling channel 770 illustrated in FIG. 7 differs from previous cooling channels in that it is substantially formed within the body of the first semiconductor device 704A, through etching.

It should be appreciated that although FIG. 7 illustrates two sidewalls 760A, 760B forming a cavity volume, this is non-limiting and in other embodiments, the first semiconductor device may comprise more than two sidewalls, for example, three sidewalls, four sidewalls or more. The additional sidewalls may be formed between sidewalls 760A, 760B. The sidewalls may form more than one cavity volume, for example, two cavity volumes, three cavity volumes or more and the cavity volumes may form more than one cooling channel, for example two cooling channels, three cooling channels or more.

Figure 8:
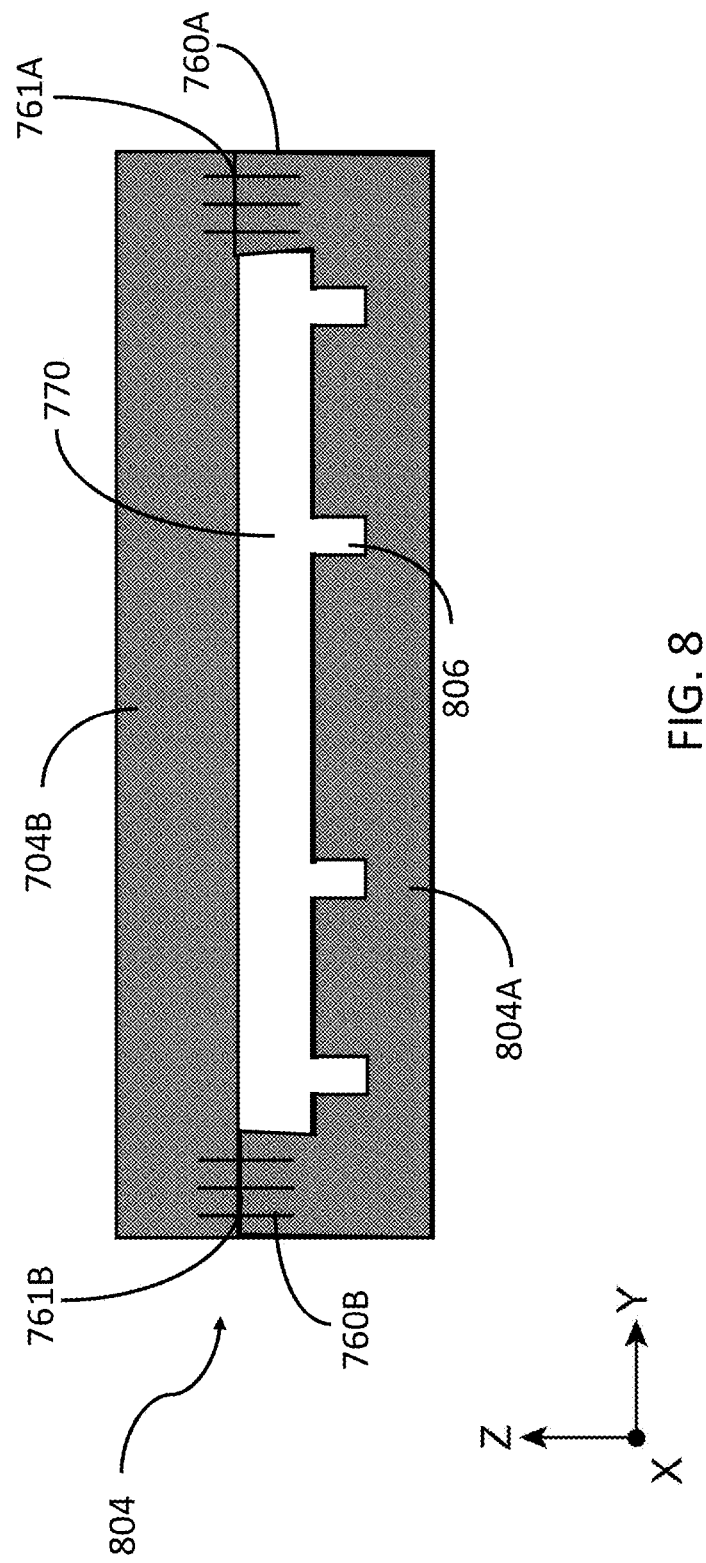
FIG. 8 is a schematic sectional view of an example semiconductor stack, in accordance with embodiments of the disclosure.

FIG. 8 is a schematic cross-sectional view of a semiconductor stack 804 according to another embodiment. The semiconductor stack 804 is similar to the semiconductor stack 704 and thus the same elements of the semiconductor stack 804 has been given the same reference numeral as the semiconductor stack 704. The description of these elements are not repeated for conciseness. The semiconductor stack 804 differs from the semiconductor stack 704 in that the lower surface of the first semiconductor device 704B comprises channel sidewalls extending into the first semiconductor device to define at least one groove 806 (e.g., by etching). This may be advantages in that a surface contact area between a coolant fluid and the first semiconductor device 804A is increased which may improve cooling efficiency. In addition, the coolant fluid penetrates deeper into the first semiconductor device 804A, further improving heat exchange between the coolant fluid and the first semiconductor device 804A.

In some embodiments, a thickness of the opposing sidewalls in a direction orthogonal to the lower surface of the second semiconductor device is less than 200 microns or is less than or equal to 100 microns. This may be advantages in that an impedance and a pitch size of vias disposed in the sidewalls may be reduced and the number density of the vias can be increased.

Figure 9A:
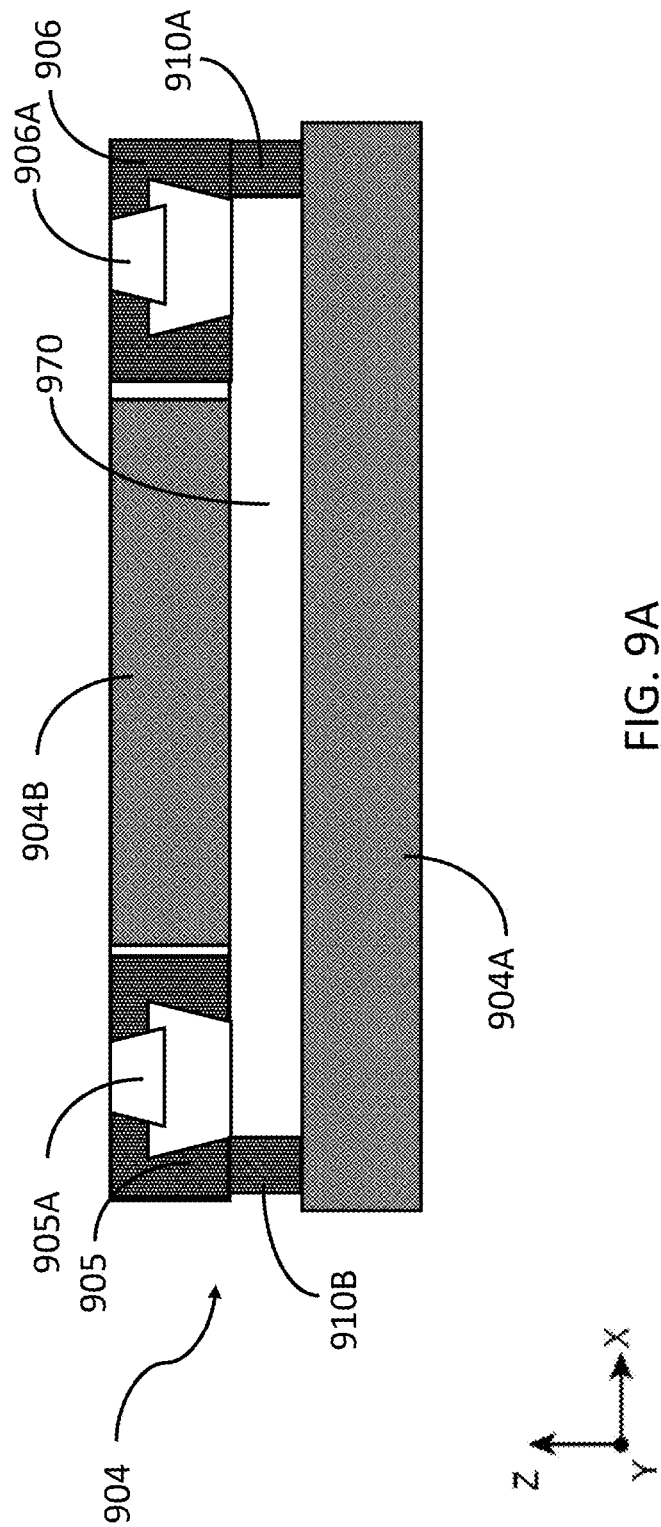
FIG. 9A is a schematic sectional view of an example semiconductor stack, in accordance with embodiments of the disclosure.
Figure 9B:
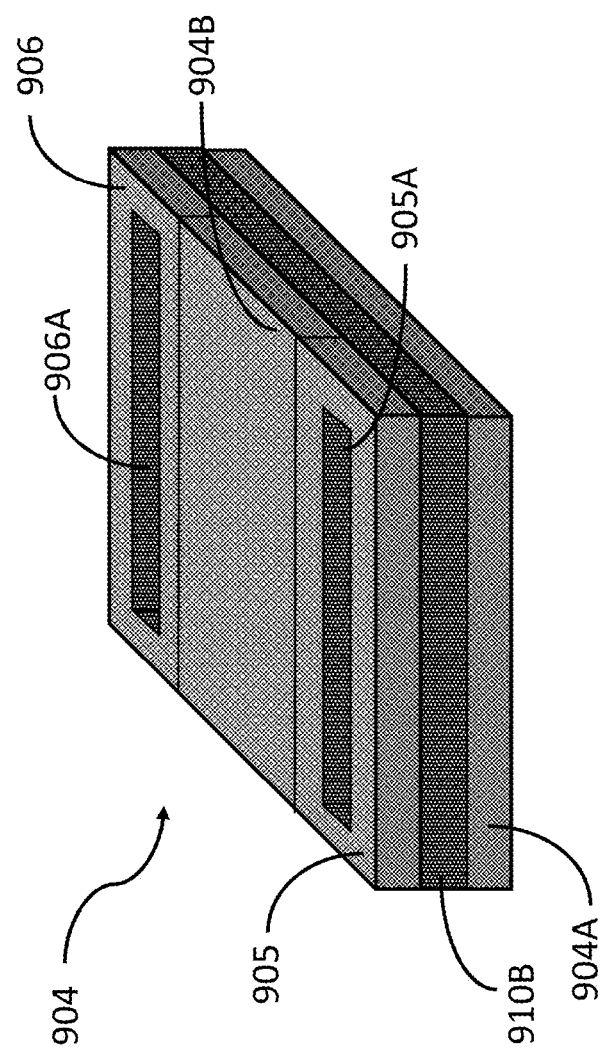
FIG. 9B is a perspective view of a semiconductor stack according to an embodiment.

FIG. 9A is a schematic cross-sectional view of a semiconductor stack 904 in the X-Z plane of FIG. 2B, according to another embodiment. FIG. 9B shows a perspective view of the semiconductor stack 904. With reference to FIGS. 9A and 9B. The semiconductor stack 904 may comprise one or more spacers similar to spacers according to any previous embodiment. However the spacers are not shown for simplicity. The spacers may extend laterally between first and second opposite edges of the semiconductor stack 904 in a first direction (i.e. in the X-axis direction. The semiconductor stack 904 further comprises a first semiconductor device 904A, a second semiconductor device 904B, a cooling channel 970, reconstituted wafer portions 905 and 906 and edge supports 910A and 910B. At least one of the spacers may comprise vias electrically connecting the first semiconductor device 904A and the second semiconductor device 904B. The second semiconductor device 904B comprises a width in the first direction that is less than a width of the first semiconductor device 904A in the same direction. The reconstituted wafer portions may be portions of a reconstituted wafer or a dummy die. A dummy die may comprise a non-operational die, filler (encapsulant) material, a portion of a reconstituted wafer, a blank carrier, and/or the like. The reconstituted wafer portions are disposed above and across the spacers orthogonal to the first direction (i.e. perpendicular to the first direction, in other words orthogonal to the direction the spacers extend or a length of the spacers). The second semiconductor device is disposed between the reconstituted wafer portions. The second semiconductor device and the reconstituted wafer portions may form a reconstituted wafer and may be surrounded by molding (e.g., epoxy) during a reconstitution process. The reconstituted wafer portions may comprise a first reconstituted wafer portion 905 and a second reconstituted wafer portion 906. The edge supports 910A and 910B may extend along the edges of the semiconductor stack 904 perpendicular to the first direction, between the spacers. The first reconstituted wafer portion 905 is disposed on a first edge support 910B and the second reconstituted wafer portion 906 is disposed on a second edge support 910A. A reconstituted wafer is taken to be a wafer comprising dies, die interconnects and a molding compound. For example, a semiconductor wafer may be singulated into dies and a molding compound may be disposed around the dies to form a reconstituted wafer. The dies may be arranged in a layout according to a desired spacing between the dies. In some embodiments, the molding is a dielectric layer. Reconstituting dies to form a reconstituted wafer allows dies previously singulated from a wafer to be molded into a new wafer (i.e., a reconstituted wafer).

The first edge support 910A and the second edge support 910B may be formed in a similar manner to the spacers, as discussed in more detail below.

The first reconstituted wafer portion 905 may comprise an inlet opening 905A and the second reconstituted wafer portion 906 may comprise an outlet opening 906A and the cooling channel may be in fluid communication with the inlet opening and the outlet openings 905A, 906A. The inlet and outlet opening 905A and 906A may be formed by using an etching process. With reference to FIGS. 2C and 2D, the inlet opening 905A may be in fluid communication with the inlet opening of the package cover 208 and the inlet opening of the sealing material layer 222 and the outlet opening 906A may be in fluid communication with the outlet opening of the package cover 208 and the outlet opening of the sealing material layer 222. Thus, a coolant fluid may enter through the inlet opening 905A, flow through the cooling channel 970 and exit via the outlet openings 906A.

Figure 10:
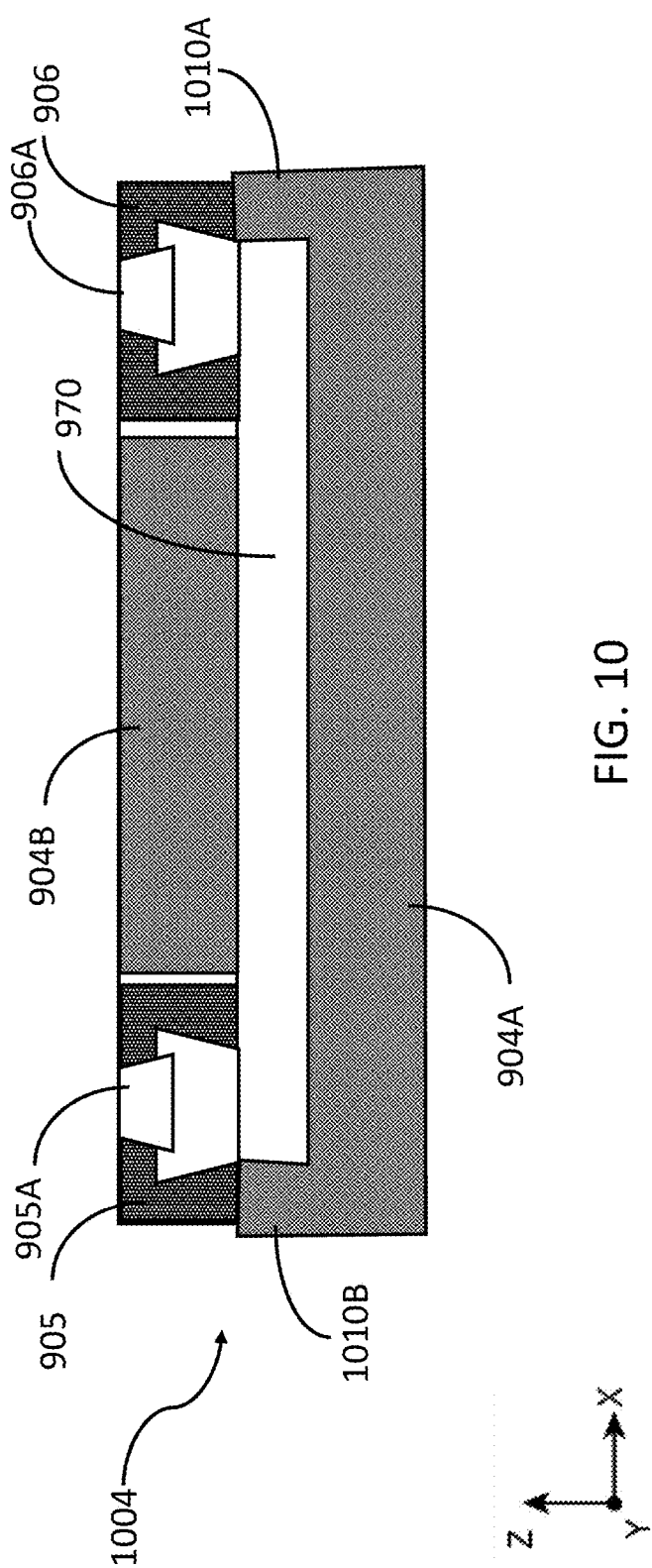
FIG. 10 is a schematic sectional view of an example semiconductor stack, in accordance with embodiments of the disclosure.

FIG. 10 is a schematic cross-sectional view of a semiconductor stack 1004 in the X-Z plane of FIG. 2B, according to another embodiment. The semiconductor stack 1004 is similar to the semiconductor stack 904, and thus the same elements of the semiconductor stack 1004 has been given the same reference numeral as the semiconductor stack 904. The description of these elements are not repeated for conciseness. The semiconductor stack 1004 differs from the semiconductor stack 904 in that the semiconductor stack 1004 comprise a first semiconductor device 1004A that comprises cavity sidewalls 1010A, 1010B extending perpendicularly in the first direction (i.e. in the Y-axis direction). The cavity sidewalls 110A, 110B extend upwardly towards the reconstituted wafer portions 905, 906 and the reconstituted wafer portions 905 and 906 are disposed thereupon. The cavity sidewalls may be formed by using an etch process on the backside of the first semiconductor device 1004A. It should be apparent that a perspective view of the semiconductor stack 1004 may be similar to the perspective view of the semiconductor stack 904 shown in FIG. 9B with the exception that the sidewalls of the semiconductor stack 1004 are extended towards the reconstituted wafer portions 905 and 906 and the reconstituted wafer portions 905 and 906 are disposed thereupon.

Figure 11:
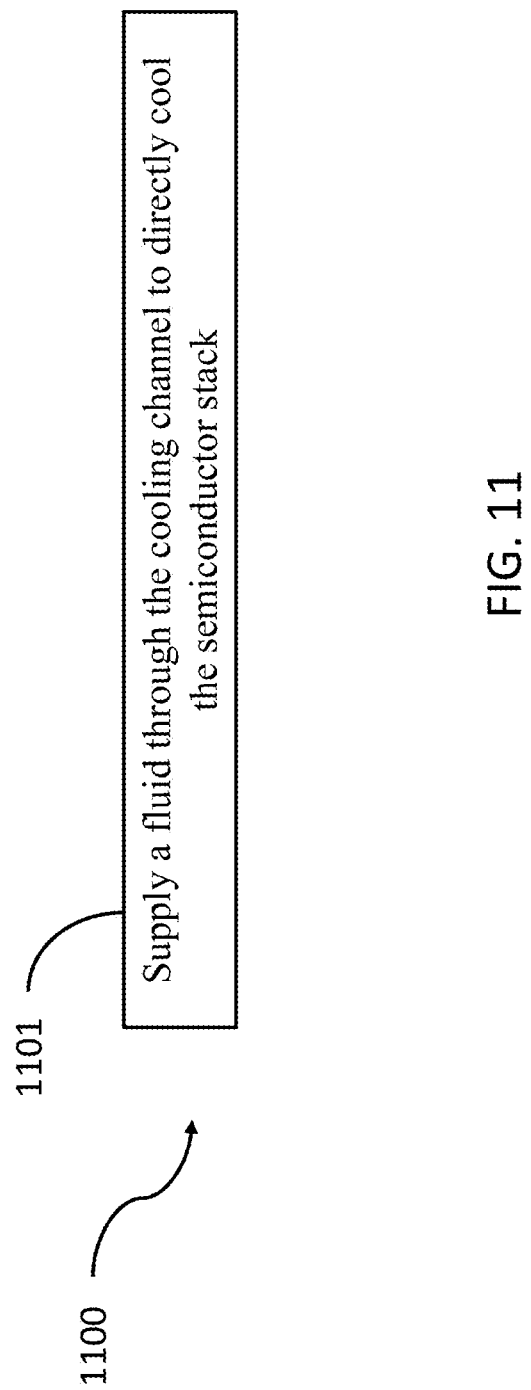
FIG. 11 shows a method of using a device package in accordance with one or more embodiments.

FIG. 11 is a method 1100 of using a device package in accordance with one or more embodiments. At step 1101, a fluid is supplied through a cooling channel to directly cool the semiconductor stack. For example, with reference to FIG. 2C and FIG. 2D, coolant fluid may be supplied (e.g., delivered) into an inlet opening of the package cover 208 and an inlet opening of the sealing material layer 222 from coolant lines 108. The coolant fluid may subsequently pass through cooling channel 270 within a semiconductor stack 204. The coolant fluid may subsequently exit through an outlet opening of the package cover 208 and outlet opening of the sealing material layer 222 and into coolant lines 108.

In some embodiments, suppling the fluid may comprise supplying different types of coolant fluid. For example, the fluid may comprise a mixture of water and glycol.

Figure 12:
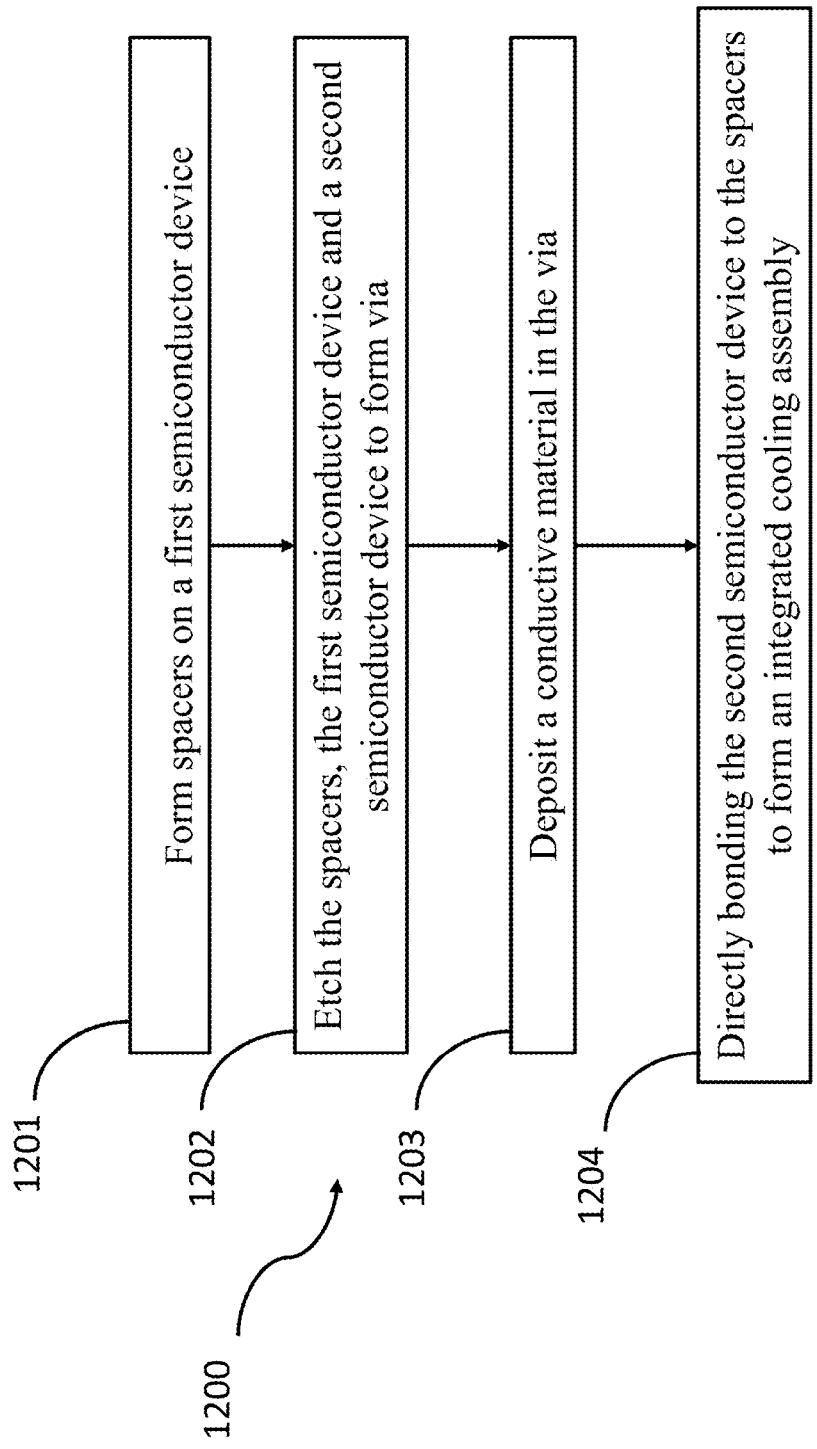
FIG. 12 shows a method that can be used to manufacture a device package in accordance with one or more embodiments.

FIG. 12 is a method 1200 of manufacturing a device package in accordance with one or more embodiments. At step 1201, the method includes forming spacers on a first semiconductor device. For example, the spacers may be formed by using a lithography process. At step 1202, the spacers, the first semiconductor device and a second semiconductor device are etched to form via therethrough. The etching process may comprise using a patterned mask layer and the anisotropic etch process uses inherently differing etch rates for the silicon material which is exposed to an anisotropic etchant when the patterned mask layer is formed.

In some embodiments, the etching process is controlled to where the etch rates of the exposed silicon material have a ratio between about 1:10 and about 1:200, such as between about 1:10 and about 1:100, for example between about 1:10 and 1:50, or between about 1:25 and 1:75. Examples of suitable anisotropic wet etchants include aqueous solutions of potassium hydroxide (KOH), ethylene diamine and pyrocatechol (EPD), ammonium hydroxide (HN4OH), hydrazine (N2H4), or tetra methyl ammonium hydroxide (TMAH). The actual differing etch rates depend on the concentration of the etchant in the aqueous solution, the temperature of the aqueous solution, and a concentration of the dopant in the substrates (if any).

Typically, the mask layer is formed of a material which is selective to anisotropic etch compared to the underlying monocrystalline silicon substrate. Examples of suitable mask materials include silicon oxide ($Si_xO_y$) or silicon nitride (SixNy). In some embodiments, the mask layer has a thickness of about 100 nm or less, such as about 50 nm or less, or about 30 nm or less. The mask layer may be patterned using any suitable combination of lithography and material etching patterning methods.

At step 1203, a conductive material (e.g., metal, such as copper) is deposited in the via. At step 1204, the second semiconductor device is directly bonded to upper surfaces of the spacers to form an integrated cooling assembly including a cooling channel formed between the first and second semiconductor devices and electrically connected via between the first semiconductor device and the second semiconductor device. The first semiconductor devices may be formed on a first substrate and the second semiconductor device may be formed on a second substrate. The substrates may include a bulk material, and a plurality of material layers disposed on the bulk material. The bulk material may include any semiconductor material suitable for manufacturing semiconductor devices, such as silicon, silicon germanium, germanium, group III-V semiconductor materials, group II-VI semiconductor materials, or combinations thereof. For example, in some embodiments, the substrates may include a monocrystalline wafer, such as a silicon wafer, a plurality of device components formed in or on the silicon wafer, and a plurality of interconnect layers formed over the plurality of device components. In other embodiments, the substrates may comprise a reconstituted substrate, e.g., a substrate formed from a plurality of singulated devices embedded in a support material. As described above, the bonding surfaces may each comprise a dielectric material layer, and directly bonding surfaces of the spacers to surfaces of the first and second substrates includes forming dielectric bonds between the dielectric material layers. Optionally, the spacers may be directly bonded to the first and second substrates using a hybrid of the dielectric bonds and metal bonds formed between the metal features.

Generally, directly bonding surfaces (of the dielectric material layers) includes preparing, aligning, and contacting the surfaces. Preparing the surfaces may include smoothing the respective surfaces to a desired surface roughness, such as between 0.1 to 3.0 nm RMS, activating the surfaces to weaken or open chemical bonds in the dielectric material, and terminating the surfaces with a desired species. Smoothing the surfaces may include polishing the substrates and the spacers using a chemical mechanical polishing (CMP) process. Activating and terminating the surfaces with a desired species may include exposing the surfaces to radical species formed in a plasma.

In some embodiments, the plasma is formed using a nitrogen-containing gas, e.g., N2, and the terminating species includes nitrogen and hydrogen. In some embodiments, the surfaces may be activated using a wet cleaning process, e.g., by exposing the surfaces to an aqueous ammonia solution. In some embodiments, the dielectric bonds may be formed using a dielectric material layer deposited between the semiconductor devices. In those embodiments, the direct dielectric bonds may be formed by contacting the deposited dielectric material layer directly with a bulk material surface the semiconductor devices.

Directly forming direct dielectric bonds between the spacers and the semiconductor devices includes bringing the prepared and aligned surfaces into direct contact at a temperature less than 150° C., such as less than 100° C., for example, less than 30° C., or about room temperature, e.g., between 20° C. and 30° C. Without intending to be bound by theory, it is believed that the hydrogen terminating species diffuse from the interfacial bonding surfaces, and chemical bonds are formed between the remaining nitrogen species during the direct bonding process. In some embodiments, the direct bond is strengthened using an anneal process, where the substrates and the spacers are heated to and maintained at a temperature of greater than about 30° C. and less than about 450° C., for example, greater than about 50° C. and less than about 250° C., or about 150° C. for a duration of about 5 minutes or more, such as about 15 minutes. Typically, the bonds will strengthen over time even without the application of heat. Thus in some embodiments, the method does not include heating the semiconductor devices.

After the dielectric bonds are formed, the integrated cooling assembly may be heated to a temperature of 150° C. or more and maintained at the elevated temperature for a duration of about 1 hour or more, such as between 8 and 24 hours, to form direct metallurgical bonds between the metal features. Suitable direct dielectric and hybrid bonding technologies that may be used to perform aspects of the methods described herein include ZiBond® and DBI®, each of which are commercially available from Adeia Holding Corp., San Jose, CA, USA.

In some embodiments, at step 1201, forming spacers on a first semiconductor device comprises depositing an interposer on the first semiconductor device and etching a central portion of the interposer disposed between the opposing surfaces of the devices to form the spacers. The remaining portion of the interposer may extend around a perimeter of the semiconductor stack to form the spacers as well as providing a means for interconnecting with external devices (e.g., by extending through sidewalls of the device cover 208). The centrally etched portion of the interposer forms the cooling channel through which coolant fluid may flow.

Figure 13:
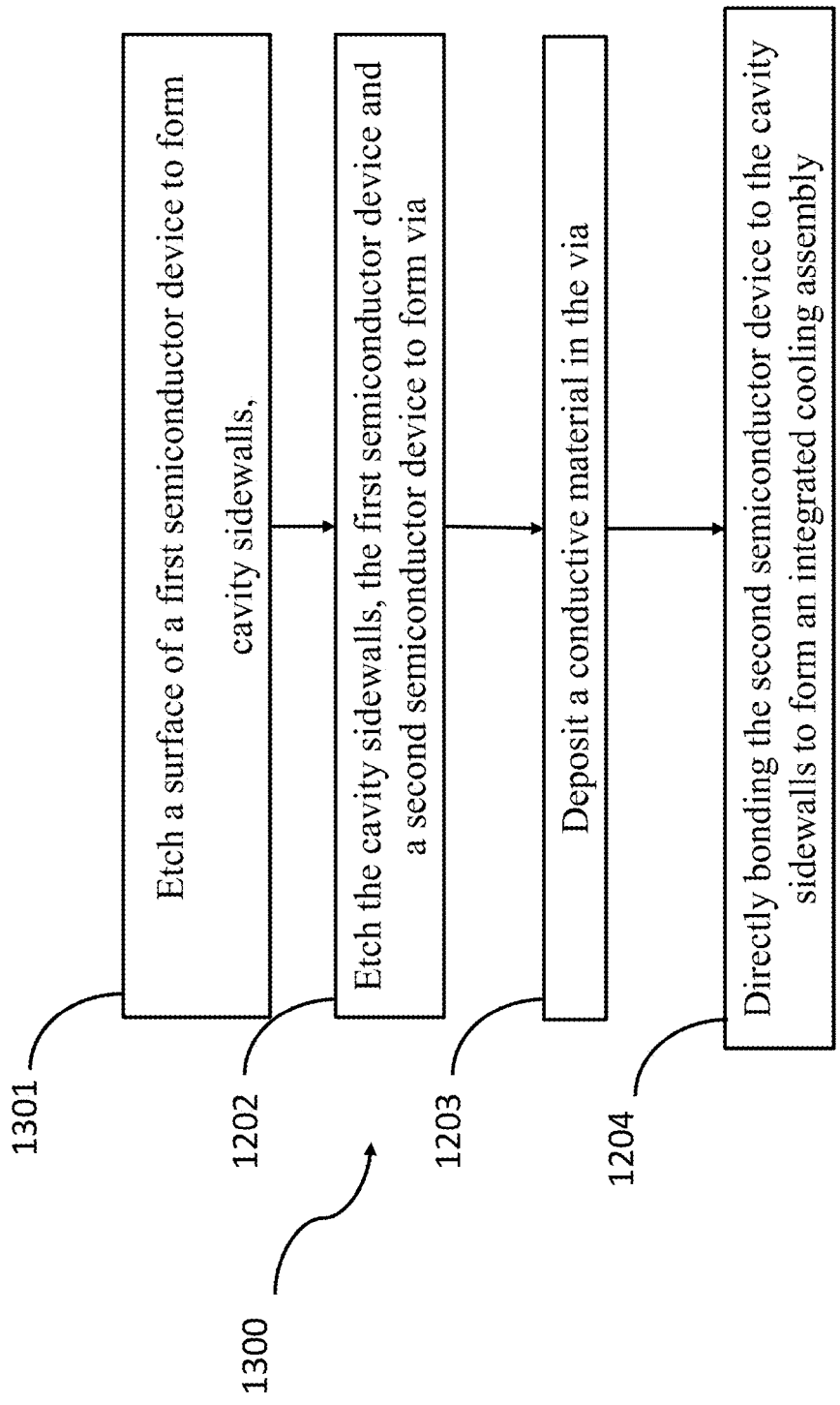
FIG. 13 shows a method that can be used to manufacture a device package in accordance with one or more embodiments.

FIG. 13 is a method 1300 of manufacturing a device package in accordance with one or more embodiments. The method comprise at a step 1201, a surface of a first semiconductor device is etched to form cavity sidewalls defining a cavity volume (e.g., cooling channel). At step 1302, the cavity sidewalls, the first semiconductor device and a second semiconductor device are etched to form via. At step 1303, a conductive material is deposited in the via. At step 1304, the second semiconductor device is directly bonded to upper surfaces of the cavity sidewalls to form an integrated cooling assembly including a cooling channel formed between the first and second semiconductor and electrically connected via between the first semiconductor device and the second semiconductor device. The second semiconductor device may be bonded to upper surfaces of the cavity sidewalls using the direct bonding process described above in relation to method 1200.

The embodiments discussed above are intended to be illustrative and not limiting. One skilled in the art would appreciate that individual aspects of the cooling assemblies, device packages, and methods discussed herein may be omitted, modified, combined, and/or rearranged without departing from the scope of the disclosure.

What is claimed is:

1. A device package comprising:
   an integrated cooling assembly comprising a semiconductor stack and a cooling channel, wherein:
   the semiconductor stack comprises:
   a first semiconductor device and a second semiconductor device stacked vertically above the first semiconductor device; and
   spacers extending between opposing surfaces of the first and second semiconductor devices to space the first semiconductor device away from the second semiconductor device, wherein the spacers are attached to the opposing surfaces of the first and second semiconductor devices by direct hybrid bonds;

the spacers and the opposing surfaces of the first and second semiconductor devices collectively define a portion of the cooling channel therebetween; and the spacers comprise via electrically connecting the first semiconductor device and the second semiconductor device.

2. The device package of claim 1, wherein a thickness of the spacers in a direction orthogonal to the opposing surfaces of the semiconductor devices is less than 200 microns.

3. The device package of claim 1, wherein the spacers form a portion of an interposer disposed between the first and second semiconductor devices.

4. The device package of claim 3, wherein the interposer extends beyond at least an edge of the first semiconductor device and/or an edge of the second semiconductor device.

5. The device package of claim 1, wherein:
the spacers extend laterally between first and second opposite edges of the semiconductor stack in a first direction;
a width of the second semiconductor device in the first direction is less than a width of the first semiconductor device in the same direction.

6. The device package of claim 5, wherein the semiconductor stack further comprises:
first and second reconstituted wafer portions disposed above and across the spacers (not shown) in a direction substantially orthogonal to the first direction;
the second semiconductor device is disposed between the first and second reconstituted wafer portions.

7. The device package of claim 5, wherein:
the first reconstituted wafer portion comprises an inlet opening and the second reconstituted wafer portion comprises an outlet opening; and
the cooling channel is in fluid communication with the inlet opening and the outlet opening.

8. The device package of claim 1, wherein a width of the spacers is less than 500 microns in a direction parallel to the opposite surfaces of the semiconductor devices.

9. The device package of claim 1, wherein a thickness of the spacers defines a height of the cooling channel in a direction orthogonal to the opposite surfaces of the semiconductor devices.

10. The device package of claim 1, wherein:
a width of the cooling channel is defined by a distance between the spacers;
a thickness of the spacers defines a height of the cooling channel in a direction orthogonal to the opposite surfaces of the semiconductor devices; and
a width to height aspect ratio of the cooling channel is 100 to 1.

11. The device package of claim 1, wherein:
a width of the cooling channel is defined by a distance between the spacers;
a thickness of the spacers defines a height of the cooling channel in a direction orthogonal to the opposite surfaces of the semiconductor devices; and
a width to height aspect ratio of the cooling channel is 42.5 to 1.

12. The device package of claim 1, wherein at least one of the spacers is disposed across centrally aligned regions of the first semiconductor device and the second semiconductor device.

13. The device package of claim 1, wherein the spacers and the opposing surfaces of the first and second semiconductor devices collectively define a plurality of cooling channels therebetween.

14. A device package comprising:
an integrated cooling assembly comprising a semiconductor stack and a cooling channel, wherein:
the semiconductor stack comprises a first semiconductor device and a second semiconductor device stacked vertically above the first semiconductor device;
the first semiconductor device comprises opposing sidewalls extending upwardly to the second semiconductor device to define a cavity volume;
the opposing sidewalls, a lower surface of the second semiconductor device facing the cavity volume, and an upper surface of the first semiconductor device collectively define a continuous boundary of a portion of the cooling channel therebetween; and
the opposing sidewalls comprise vias electrically connecting the first semiconductor device and the second semiconductor device.

15. The device package of claim 14, wherein the lower surface of the first semiconductor device comprises channel sidewalls extending into the first semiconductor device to define at least one groove.

16. The device package of claim 14, wherein a thickness of the opposing sidewalls in a direction orthogonal to the lower surface of the second semiconductor device is less than 200 microns.

17. The device package of claim 14, wherein the first semiconductor device is attached to the second semiconductor device by direct dielectric bonds.

18. The device package of claim 14, wherein the first semiconductor device is attached to the second semiconductor device by direct hybrid bonds.

* * * * *